(12) United States Patent
Kim et al.

(10) Patent No.: US 12,243,861 B2
(45) Date of Patent: Mar. 4, 2025

(54) DISPLAY DEVICE USING MICRO LED, AND MANUFACTURING METHOD THEREFOR

(71) Applicant: LG ELECTRONICS INC., Seoul (KR)

(72) Inventors: Dohan Kim, Seoul (KR); Jeonghyo Kwon, Seoul (KR); Soohyun Kim, Seoul (KR); Indo Chung, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 245 days.

(21) Appl. No.: 17/770,855

(22) PCT Filed: Oct. 22, 2019

(86) PCT No.: PCT/KR2019/013898
§ 371 (c)(1),
(2) Date: Apr. 21, 2022

(87) PCT Pub. No.: WO2021/080028
PCT Pub. Date: Apr. 29, 2021

(65) Prior Publication Data
US 2022/0375915 A1    Nov. 24, 2022

(30) Foreign Application Priority Data

Oct. 22, 2019    (KR) .................... 10-2019-0131263

(51) Int. Cl.
| | |
|---|---|
| H01L 25/16 | (2023.01) |
| H01L 23/00 | (2006.01) |
| H01L 27/12 | (2006.01) |

(52) U.S. Cl.
CPC ............ *H01L 25/167* (2013.01); *H01L 24/29* (2013.01); *H01L 24/83* (2013.01); *H01L 27/124* (2013.01);
(Continued)

(58) Field of Classification Search
None
See application file for complete search history.

(56) References Cited

U.S. PATENT DOCUMENTS

| | | | | |
|---|---|---|---|---|
| 5,796,169 | A | * 8/1998 | Dockerty | .......... H01L 23/49838 |
| | | | | 257/E21.511 |
| 2007/0252289 | A1 | 11/2007 | Brewer | |
| 2022/0352446 | A1 | 11/2022 | Chung et al. | |

FOREIGN PATENT DOCUMENTS

| | | |
|---|---|---|
| JP | 2015-11784 A | 1/2015 |
| KR | 10-2017-0091805 A | 8/2017 |

(Continued)

OTHER PUBLICATIONS

Machine-generated English translation of KR 10-2018-0082003 (Year: 2018).*
Machine-generated English translation of KR 10-2019-0099164 (Year: 2019).*

*Primary Examiner* — Bo B Jang
(74) *Attorney, Agent, or Firm* — Birch, Stewart, Kolasch & Birch, LLP

(57) ABSTRACT

The present disclosure provides a novel form of a display device which enables semiconductor light emitting elements having a vertical structure to be assembled onto a substrate and then wiring process to be performed stably without any change to the position of the elements during post-processing. The display device according to one embodiment of the present disclosure comprises: a substrate; a pair of assembly electrodes positioned on the substrate; a dielectric layer positioned on the assembly electrodes; a wiring electrode positioned on the dielectric layer and comprising a base electrode part and a low melting point junction; a partition wall which overlaps with a portion of the wiring electrode, is positioned on the dielectric layer, and defines an assembly groove to which a semiconductor light emitting element is assembled; and the vertical semiconductor light emitting (Continued)

(a)

(b)

element which is assembled in the assembly groove and is electrically connected to the low melting point junction of the wiring electrode, wherein the low melting point junction has a flow stop angle for controlling the thermal flow characteristic of the junction.

17 Claims, 26 Drawing Sheets

(52) U.S. Cl.
CPC .......... *H01L 27/1259* (2013.01); *H01L 24/05* (2013.01); *H01L 24/32* (2013.01); *H01L 24/95* (2013.01); *H01L 2224/05571* (2013.01); *H01L 2224/05573* (2013.01); *H01L 2224/29012* (2013.01); *H01L 2224/32145* (2013.01); *H01L 2224/83203* (2013.01); *H01L 2224/83815* (2013.01); *H01L 2224/95101* (2013.01); *H01L 2924/12041* (2013.01)

(56) References Cited

FOREIGN PATENT DOCUMENTS

| KR | 10-20170104031 A | 9/2017 |
| KR | 10-2018-0082003 A | 7/2018 |
| KR | 10-2018-0130356 A | 12/2018 |
| KR | 10-2019-0095638 A | 8/2019 |
| KR | 10-2019-0099164 A | 8/2019 |
| KR | 10-2019-0106885 A | 9/2019 |

\* cited by examiner

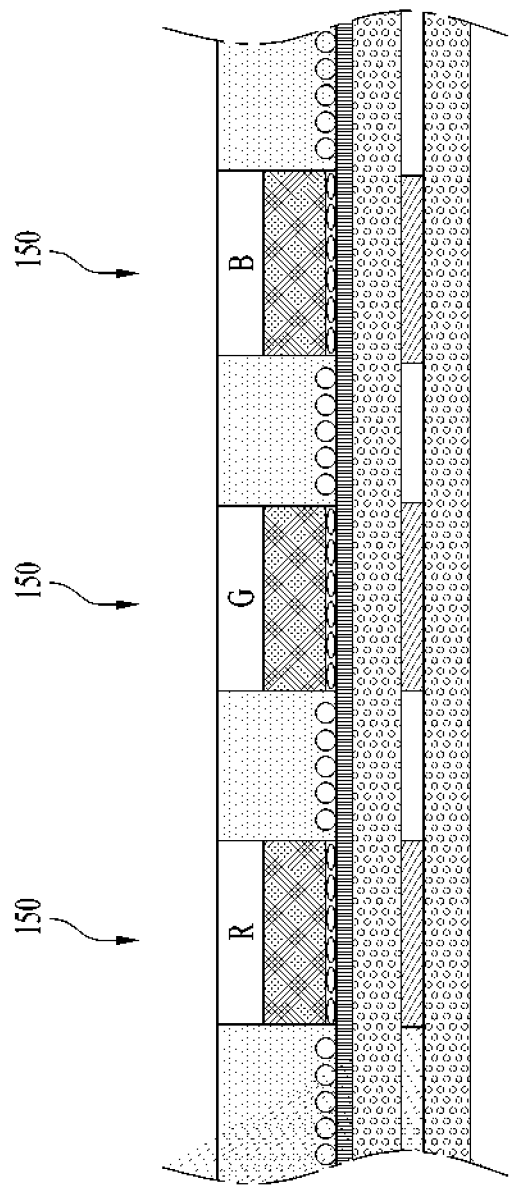

(a)  (b)

(a)  (b)

(a)

(b)

(a)  (b)

(a)

(b)

DISPLAY DEVICE USING MICRO LED, AND MANUFACTURING METHOD THEREFOR

CROSS REFERENCE TO RELATED APPLICATIONS

This application is the National Phase of PCT International Application No. PCT/KR2019/013898, filed on Oct. 22, 2019, which claims priority under 35 U.S.C. § 119 (a) to Patent Application No. 10-2019-0131263, filed in the Republic of Korea on Oct. 22, 2019, all of which are hereby expressly incorporated by reference into the present application.

TECHNICAL FIELD

The present disclosure relates to technology related to a display device, and more particularly to a method for manufacturing a display device using a micro-light emitting diode (micro-LED) and a substrate used in manufacturing the display device.

BACKGROUND ART

Recently, in a field of a display technology, display devices having excellent characteristics such as thinness, flexibility, and the like have been developed. On the other hand, currently commercialized major displays are represented by a LCD (liquid crystal display) and an OLED (organic light emitting diode).

However, the LCD has a response time that is not fast, and is difficult to be flexibly implemented.

On the other hand, LED (light emitting diode), which is a well-known semiconductor light emitting element that converts electric current into light, has been used as a light source for a display image of an electronic device including an information and communication device along with a GaP:N-based green LED, starting with commercialization of a red LED using a GaAsP compound semiconductor in 1962. Accordingly, a method for solving the above-described problems by implementing a display using the semiconductor light emitting element may be proposed. Such light emitting diode has various advantages, such as long lifespan, low power consumption, excellent initial driving characteristics, high vibration resistance, and the like, compared to a filament-based light emitting element.

In order to implement a display device using such semiconductor light emitting elements, a very large number of semiconductor light emitting elements are required. Therefore, in consideration of a manufacturing cost, a size of each semiconductor light emitting element must be miniaturized in order to increase the number of semiconductor light emitting elements that may be manufactured on the same substrate.

Accordingly, it is required to develop a semiconductor light emitting element having a vertical structure rather than a horizontal structure. However, in the case of the semiconductor light emitting element having the vertical structure, there is a disadvantage in that a wiring process for electrical connection to the substrate is difficult.

DISCLOSURE

Technical Problem

An object of an embodiment of the present disclosure is to provide a display device and a method for manufacturing the same using a semiconductor light emitting element.

Another object of an embodiment of the present disclosure is to provide a new type of display device that, after assembling a semiconductor light emitting element having a vertical structure onto a substrate, stably performs a wiring process without changing a position of the element in a subsequent process.

Further, another object of the present disclosure is to solve various problems not mentioned herein. Those skilled in the art will appreciate the embodiments of the present disclosure through the description and drawings to be described later.

Technical Solutions

A display device using a semiconductor light emitting element for achieving the above objects includes a substrate, a pair of assembly electrodes positioned on the substrate, a dielectric film positioned on the assembly electrode, a wiring electrode including a base electrode and a low-melting-point junction portion positioned on the dielectric film, a partition wall overlapping a partial region of the wiring electrode and positioned on the dielectric film, wherein the partition wall defines an assembly groove where a semiconductor light emitting element is assembled, and the vertical type semiconductor light emitting element assembled into the assembly groove and electrically connected to the low-melting-point junction portion of the wiring electrode, and the low-melting-point junction portion has a flow blocking angle for controlling a thermal flow amount thereof.

As an embodiment, the low-melting-point junction portion is positioned on the base electrode and formed in a shape of a plurality of intersecting bars.

As an embodiment, the flow blocking angle is defined in an intersection region of the plurality of bars.

As an embodiment, when the low-melting-point junction portion is melted, a thermal flow amount of the intersection region having the flow blocking angle is smaller than a thermal flow amount of ends of the plurality of bars.

As an embodiment, the semiconductor light emitting element overlaps the intersection region of the low-melting-point junction portion.

As an embodiment, the flow blocking angle is equal to or smaller than 90 degrees.

As an embodiment, the low-melting-point junction portion includes a first bar directed in a first direction and a second bar directed in a second direction intersecting the first direction.

As an embodiment, the first bar and the second bar intersect each other at a center point of the assembly groove.

As an embodiment, the first bar and the second bar intersect each other vertically.

As an embodiment, the first bar and the second bar are located in the assembly groove.

As an embodiment, the first direction corresponds to a long axis direction of the base electrode of the wiring electrode, and a length of the first bar is greater than a diameter of the assembly groove.

As an embodiment, certain regions of both ends of the second bar overlap the assembly electrodes, respectively.

As an embodiment, a height of the partition wall is smaller than a height of the semiconductor light emitting element.

As an embodiment, the low-melting-point junction portion includes a metal layer melted in a temperature range from 100 to 250 degrees.

A method for manufacturing a display device using a plurality of semiconductor light emitting elements according to another embodiment of the present disclosure includes forming a vertical type semiconductor light emitting element, preparing an assembly substrate including assembly electrodes and a wiring electrode formed thereon and an assembly groove defined therein, putting the semiconductor light emitting element into a chamber filled with fluid and placing the assembly substrate on a top surface of the chamber, assembling the semiconductor light emitting element into the assembly groove of the assembly substrate using a magnetic field and an electric field, and removing the assembly substrate from the chamber and electrically connecting the semiconductor light emitting element to the wiring electrode of the assembly substrate.

As an embodiment, the preparing of the assembly substrate includes forming the assembly electrodes on the substrate, forming a dielectric film surrounding the assembly electrodes, forming the wiring electrode on the dielectric film, and forming a partition wall positioned on the wiring electrode and defining the assembly groove therein.

As an embodiment, the forming of the wiring electrode includes forming a base electrode, and forming a low-melting-point junction portion on the base electrode.

As an embodiment, the low-melting-point junction portion includes, on the base electrode, a first bar formed in a long axis direction of the base electrode and a second bar intersecting the first bar.

As an embodiment, the first bar and the second bar are located inside the assembly groove.

As an embodiment, the electrical-connecting of the semiconductor light emitting element to the wiring electrode includes applying a pressure from above the semiconductor light emitting element, and heating and melting the low-melting-point junction portion.

Advantageous Effects

According to one embodiment of the present disclosure, it is possible to provide a display device and a method for manufacturing the same using a semiconductor light emitting element.

Specifically, the wiring electrode having the low-melting-point junction portion is formed on the bottom surface of the assembly groove of the assembly substrate in which the vertical type semiconductor light emitting element is assembled. The low-melting-point junction portion is formed in the shape of the plurality of intersecting bars, and has the flow blocking angle at each intersection. As the flow blocking angle is defined, the semiconductor light emitting element may prevent the position of the element from being changed due to the thermal flow of the low-melting-point junction portion in the subsequent wiring process. That is, according to the present disclosure, there is an advantage that the wiring process may be stably performed without the position change of the element.

Further, according to another embodiment of the present disclosure, there are additional technical effects not mentioned here. Those skilled in the art can understand the present disclosure through the purposes of the specification and drawings.

DESCRIPTION OF DRAWINGS

FIGS. 5A to 5C are conceptual diagrams illustrating various examples of color implementation with respect to a flip-chip type semiconductor light emitting element.

BEST MODE

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting element mentioned in this specification is a concept including an LED, a micro LED, and the like, and may be used interchangeably therewith.

Figure 1:
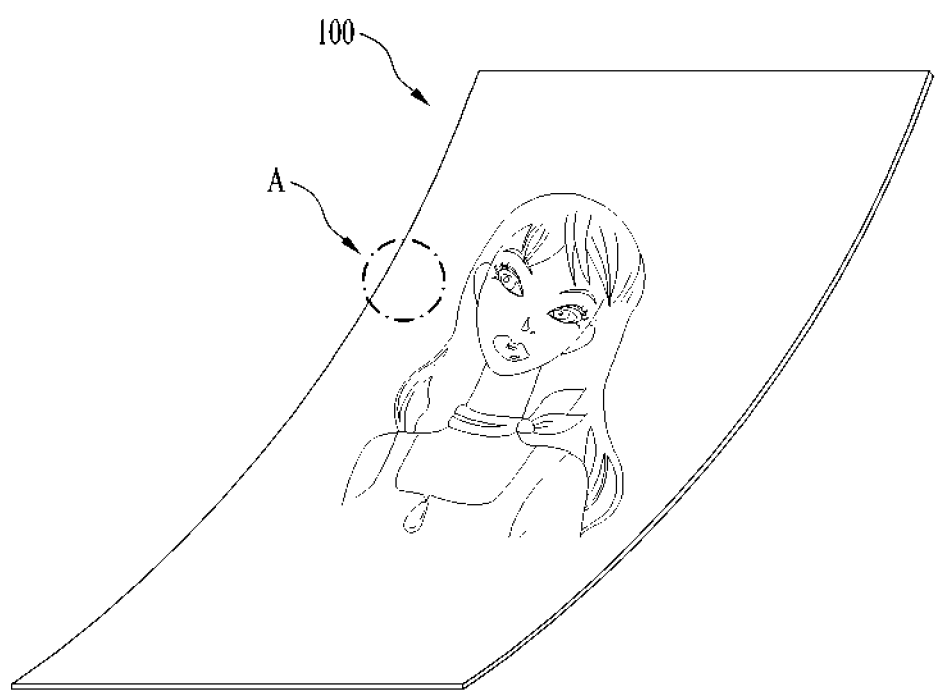
FIG. 1 is a conceptual diagram illustrating an embodiment of a display device using a semiconductor light emitting element according to the present disclosure.

FIG. 1 is a conceptual view illustrating an embodiment of a display device using a semiconductor light emitting element according to the present disclosure.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first state is changed to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a semiconductor light emitting element. In the present disclosure, a light emitting diode (LED) is exemplified as a type of the semiconductor light emitting element configured to convert electric current into light. The LED may be formed in a small size, and may thus serve as a unit pixel even in the second state.

Hereinafter, a flexible display implemented using the LED will be described in more detail with reference to the drawings.

Figure 2:
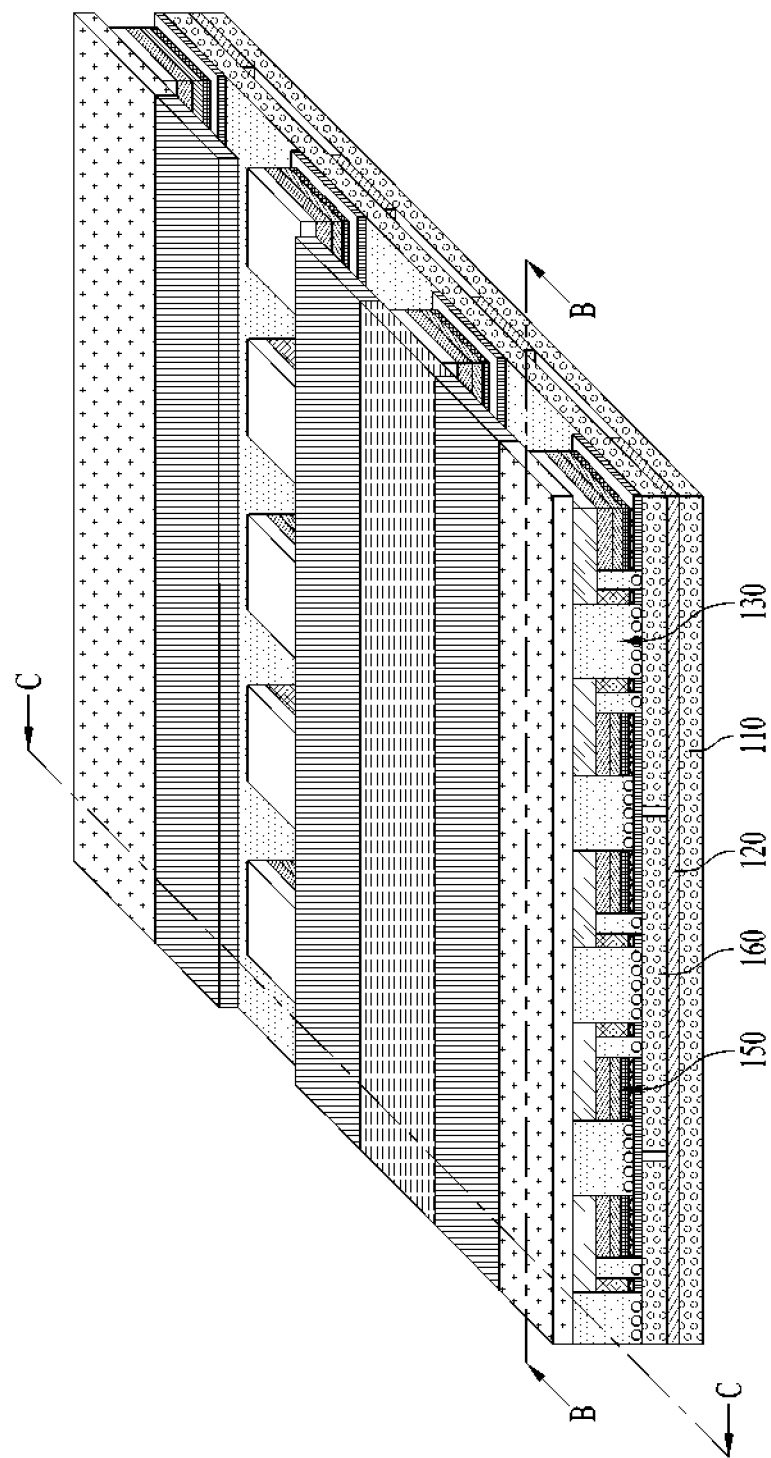
FIG. 2 is a partially enlarged diagram showing a part A shown in FIG. 1.

FIG. 2 is a partially enlarged view showing part A of FIG. 1.

Figure 3A:
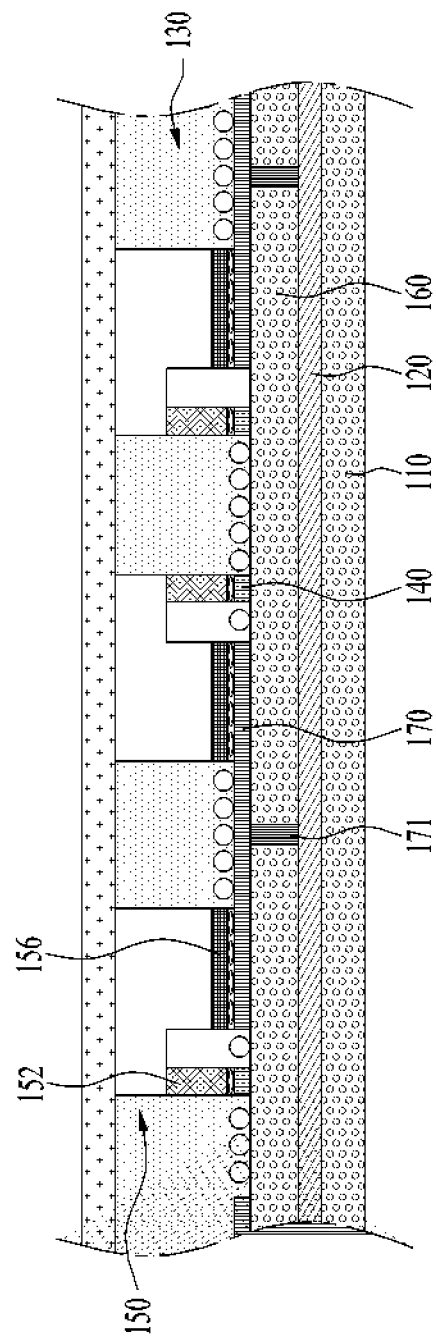
FIGS. 3A and 3B are cross-sectional diagrams taken along the cutting lines B-B and C-C in FIG. 2.
Figure 3B:
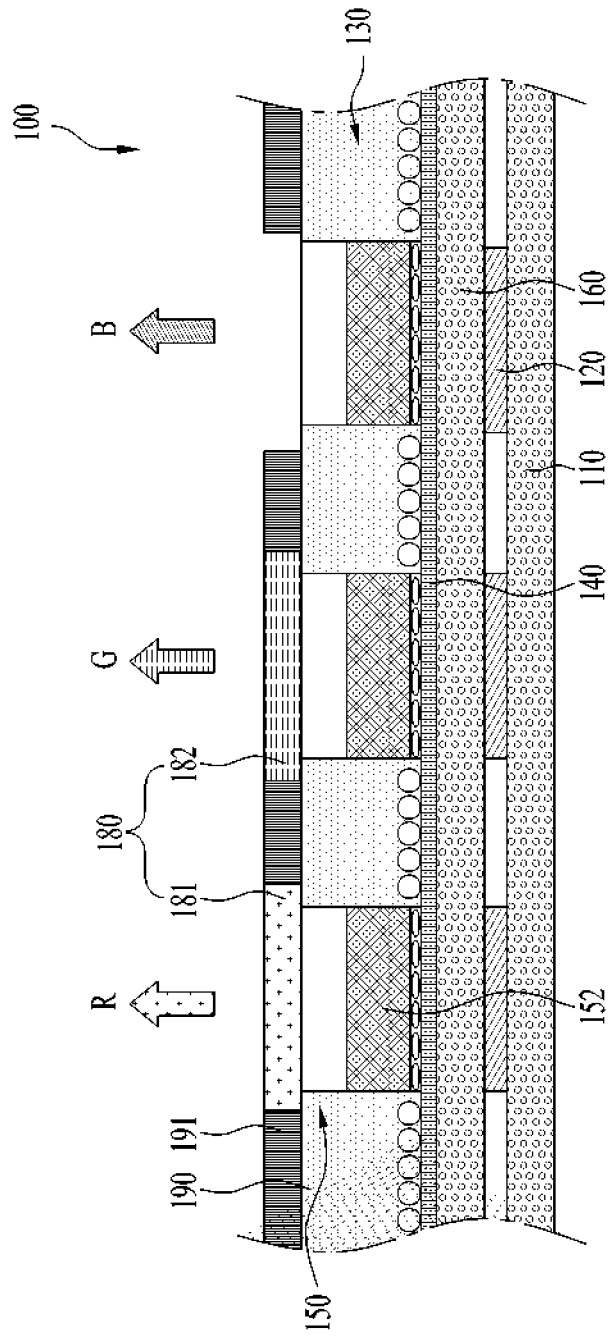

FIGS. 3A and 3B are cross-sectional views taken along lines B-B and C-C in FIG. 2.

Figure 4:
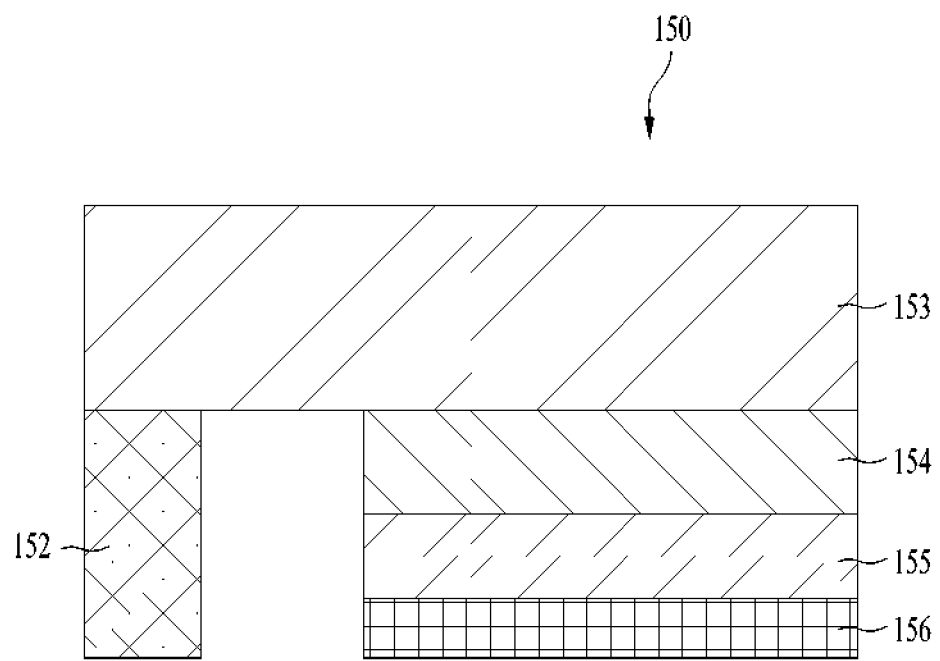
FIG. 4 is a conceptual diagram illustrating the flip-chip type semiconductor light emitting element of FIGS. 3A and 3B.

FIG. 4 is a conceptual view illustrating the flip-chip type semiconductor light emitting element of FIGS. 3A and 3B.

Figure 5B:
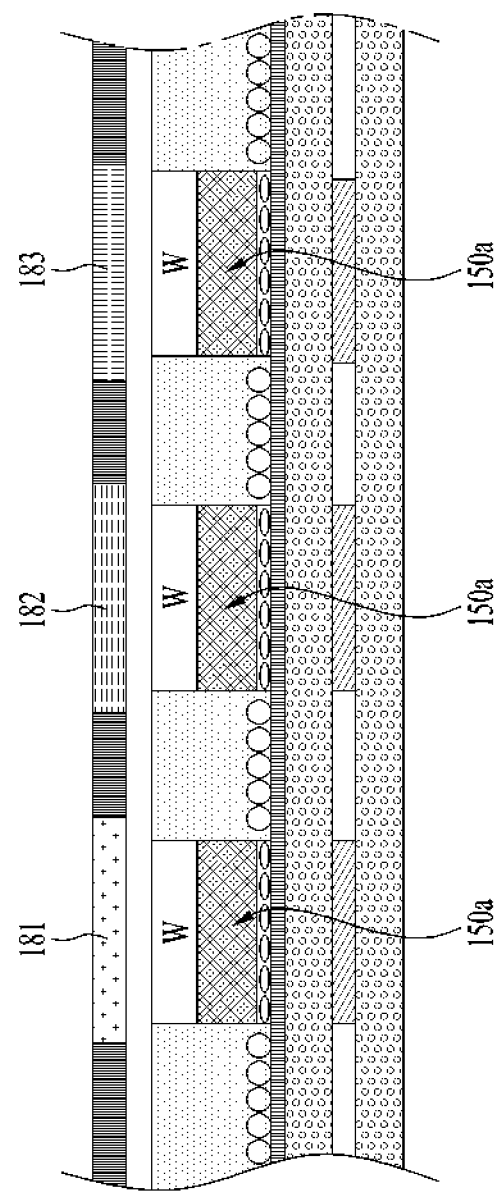
Figure 5C:
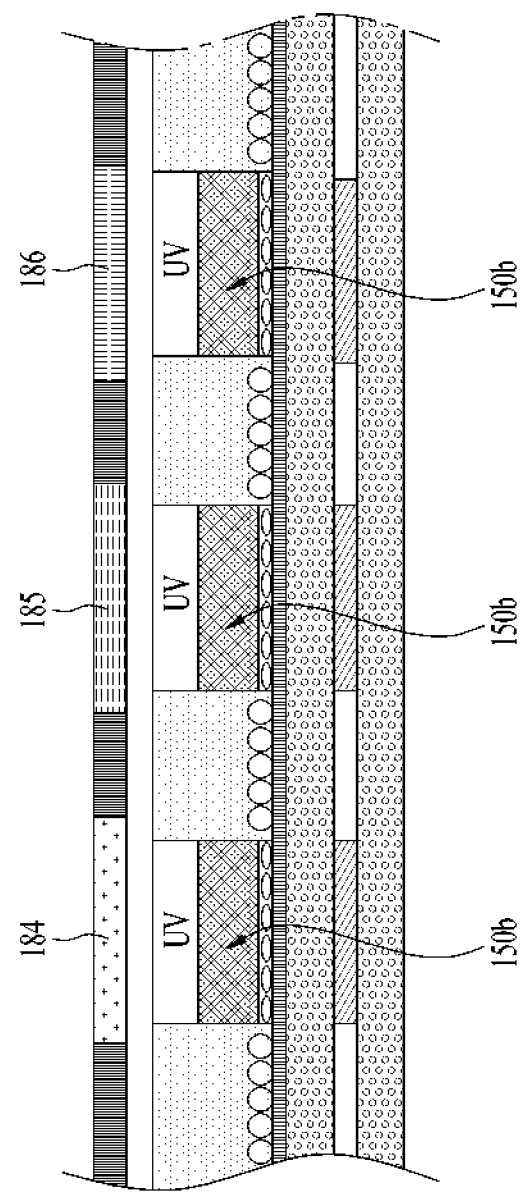

FIGS. 5A to 5C are conceptual views illustrating various examples of implementation of colors in relation to a flip-chip type semiconductor light emitting element.

As shown in FIGS. 2, 3A and 3B, the display device 100 using a passive matrix (PM) type semiconductor light emitting element is exemplified as the display device 100 using a semiconductor light emitting element. However, the examples described below are also applicable to an active matrix (AM) type semiconductor light emitting element.

The display device 100 shown in FIG. 1 may include a substrate 110, a first electrode 120, a conductive adhesive layer 130, a second electrode 140, and at least one semiconductor light emitting element 150, as shown in FIG. 2.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light emitting element 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer (hereinafter, referred to simply as a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light emitting element 150 is connected thereto in a flip-chip form by applying heat and pressure. Thereby, the semiconductor light emitting element 150 is electrically connected to the first electrode 120 and the second electrode 140.

Referring to FIG. 4, the semiconductor light emitting element may be a flip chip-type light emitting device.

For example, the semiconductor light emitting element may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIGS. 3A and 3B, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light emitting elements 150. For example, p-type electrodes of semiconductor light emitting elements on left and right sides of an auxiliary electrode may be electrically connected to one auxiliary electrode.

More specifically, the semiconductor light emitting element 150 may be press-fitted into the conductive adhesive layer 130 by heat and pressure. Thereby, only the portions of the semiconductor light emitting element 150 between the p-type electrode 156 and the auxiliary electrode 170 and between the n-type electrode 152 and the second electrode 140 may exhibit conductivity, and the other portions of the semiconductor light emitting element 150 do not exhibit conductivity as they are not press-fitted. In this way, the conductive adhesive layer 130 interconnects and electrically connects the semiconductor light emitting element 150 and the auxiliary electrode 170 and interconnects and electrically connects the semiconductor light emitting element 150 and the second electrode 140.

The plurality of semiconductor light emitting elements 150 may constitute a light emitting device array, and a phosphor conversion layer 180 may be formed on the light emitting device array.

The light emitting device array may include a plurality of semiconductor light emitting elements having different luminance values. Each semiconductor light emitting element 150 may constitute a unit pixel and may be electrically connected to the first electrode 120. For example, a plurality of first electrodes 120 may be provided, and the semiconductor light emitting elements may be arranged in, for example, several columns. The semiconductor light emitting elements in each column may be electrically connected to any one of the plurality of first electrodes.

In addition, since the semiconductor light emitting elements are connected in a flip-chip form, semiconductor light emitting elements grown on a transparent dielectric substrate may be used. The semiconductor light emitting elements may be, for example, nitride semiconductor light emitting elements. Since the semiconductor light emitting element 150 has excellent luminance, it may constitute an individual unit pixel even when it has a small size.

As shown in FIG. 3, a partition wall 190 may be formed between the semiconductor light emitting elements 150. In this case, the partition wall 190 may serve to separate individual unit pixels from each other, and may be integrated with the conductive adhesive layer 130. For example, by inserting the semiconductor light emitting element 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor conversion layer 180 may be positioned on the outer surface of the semiconductor light emitting element 150. For example, the semiconductor light emitting element 150 may be a blue semiconductor light emitting element that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue semiconductor light emitting element at a position of a unit pixel of red color, and the green phosphor 182 capable of converting blue light into green (G) light may be laminated on the blue semiconductor light emitting element at a position of a unit pixel of green color. Only the blue semiconductor light emitting element may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the semiconductor light emitting element 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

Referring to FIG. 5A, each semiconductor light emitting element may be implemented as a high-power light emitting device emitting light of various colors including blue by using gallium nitride (GaN) as a main material and adding indium (In) and/or aluminum (Al).

In this case, each semiconductor light emitting element may be a red, green, or blue semiconductor light emitting element to form a unit pixel (sub-pixel). For example, red, green, and blue semiconductor light emitting elements R, G, and B may be alternately disposed, and unit pixels of red, green, and blue may constitute one pixel by the red, green and blue semiconductor light emitting elements. Thereby, a full-color display may be implemented.

Referring to FIG. 5B, the semiconductor light emitting element 150a may include a white light emitting device W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting device W. In addition, a unit pixel may be formed using a color filter repeating red, green, and blue on the white light emitting device W.

Referring to FIG. 5C, a red phosphor conversion layer 184, a green phosphor conversion layer 185, and a blue phosphor conversion layer 185 may be provided on a ultraviolet light emitting device. Not only visible light but also ultraviolet (UV) light may be used in the entire region of the semiconductor light emitting element. In an embodiment, UV may be used as an excitation source of the upper phosphor in the semiconductor light emitting element.

Referring back to this example, the semiconductor light emitting element is positioned on the conductive adhesive layer to constitute a unit pixel in the display device. Since the semiconductor light emitting element has excellent luminance, individual unit pixels may be configured despite even when the semiconductor light emitting element has a small size.

Regarding the size of such an individual semiconductor light emitting element, the length of each side of the device may be, for example, 80 μm or less, and the device may have a rectangular or square shape. When the semiconductor light emitting element has a rectangular shape, the size thereof may be less than or equal to 20 μm×80 μm.

In addition, even when a square semiconductor light emitting element having a side length of 10 μm is used as a unit pixel, sufficient brightness to form a display device may be obtained.

Therefore, for example, in case of a rectangular pixel having a unit pixel size of 600 μm×300 μm (i.e., one side by the other side), a distance of a semiconductor light emitting element becomes sufficiently long relatively.

Thus, in this case, it is able to implement a flexible display device having high image quality over HD image quality.

The above-described display device using the semiconductor light emitting element may be prepared by a new fabricating method. Such a fabricating method will be described with reference to FIG. 6 as follows.

Figure 6:
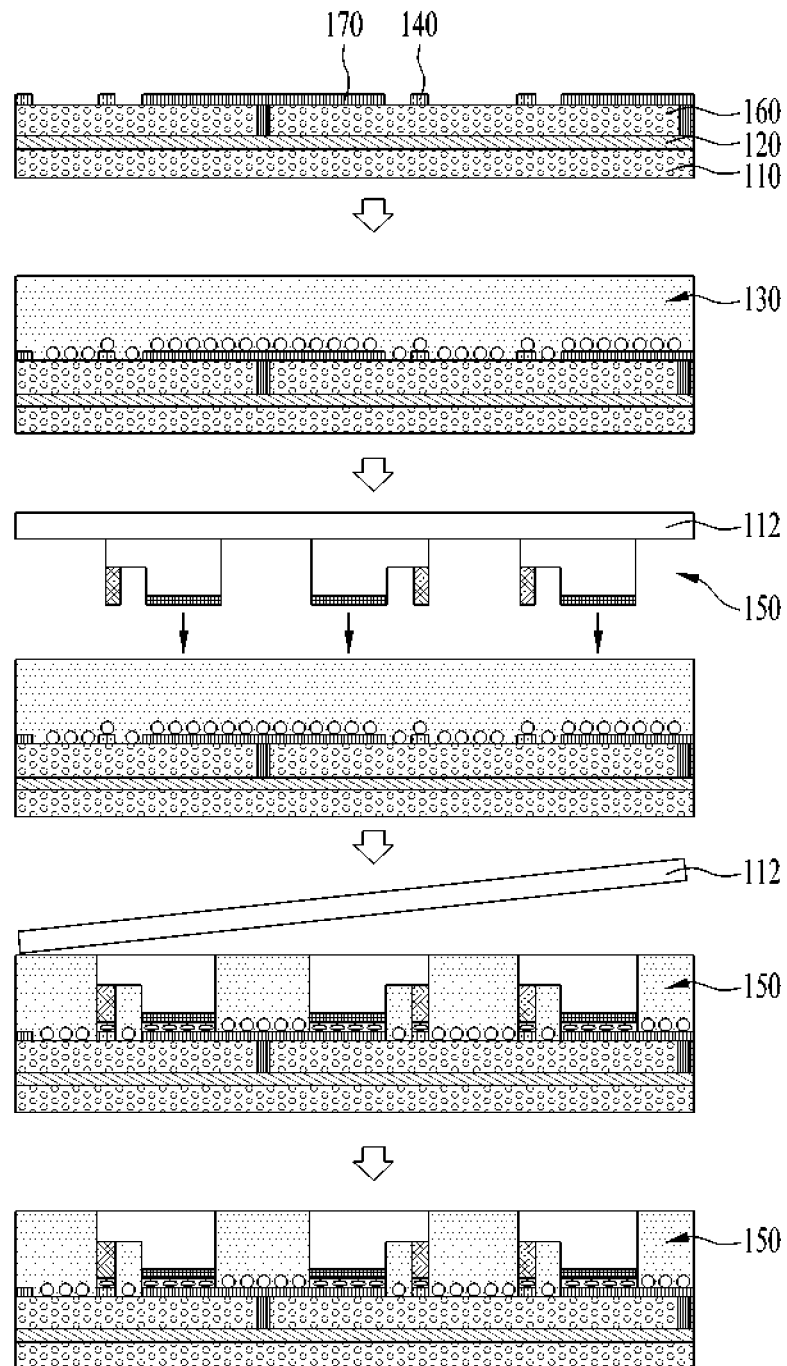
FIG. 6 shows cross-sectional views of a method of fabricating a display device using a semiconductor light emitting element according to the present disclosure.

FIG. 6 shows cross-sectional views of a method of fabricating a display device using a semiconductor light emitting element according to the present disclosure.

Referring to FIG. 6, first of all, a conductive adhesive layer 130 is formed on an insulating layer 160 located between an auxiliary electrode 170 and a second electrode 140. The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide (PI) each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light emitting elements 150 configuring individual pixels are located to correspond to locations of the auxiliary electrode 170 and the second electrodes 140, is disposed in a manner that the semiconductor light emitting element 150 confronts the auxiliary electrode 170 and the second electrode 140.

In this regard, the temporary 112 substrate 112 is a growing substrate for growing the semiconductor light emitting element 150 and may include a sapphire or silicon substrate.

The semiconductor light emitting element is configured to have a space and size for configuring a display device when formed in unit of wafer, thereby being effectively used for the display device.

Subsequently, the wiring substrate 110 and the temporary substrate 112 are thermally compressed together. By the thermocompression, the wiring substrate 110 and the temporary substrate 112 are bonded together. Owing to the property of an anisotropic conductive film having conductivity by thermocompression, only a portion among the semiconductor light emitting element 150, the auxiliary electrode 170 and the second electrode 140 has conductivity, via which the electrodes and the semiconductor light emitting element 150 may be connected electrically. In this case, the semiconductor light emitting element 150 is inserted into the anisotropic conductive film, by which a partition may be formed between the semiconductor light emitting elements 150.

Then the temporary substrate 112 is removed. For example, the temporary substrate 112 may be removed using Laser Lift-Off (LLO) or Chemical Lift-Off (CLO).

Finally, by removing the temporary substrate 112, the semiconductor light emitting elements 150 exposed externally. If necessary, the wiring substrate 110 to which the semiconductor light emitting elements 150 are coupled may be coated with silicon oxide (SiOx) or the like to form a transparent insulating layer (not shown).

In addition, a step of forming a phosphor layer on one side of the semiconductor light emitting element 150 may be further included. For example, the semiconductor light emitting element 150 may include a blue semiconductor light emitting element emitting Blue (B) light, and a red or green phosphor for converting the blue (B) light into a color of a unit pixel may form a layer on one side of the blue semiconductor light emitting element.

The above-described fabricating method or structure of the display device using the semiconductor light emitting element may be modified into various forms. For example, the above-described display device may employ a vertical semiconductor light emitting element.

Furthermore, a modification or embodiment described in the following may use the same or similar reference numbers for the same or similar configurations of the former example and the former description may apply thereto.

Figure 7:
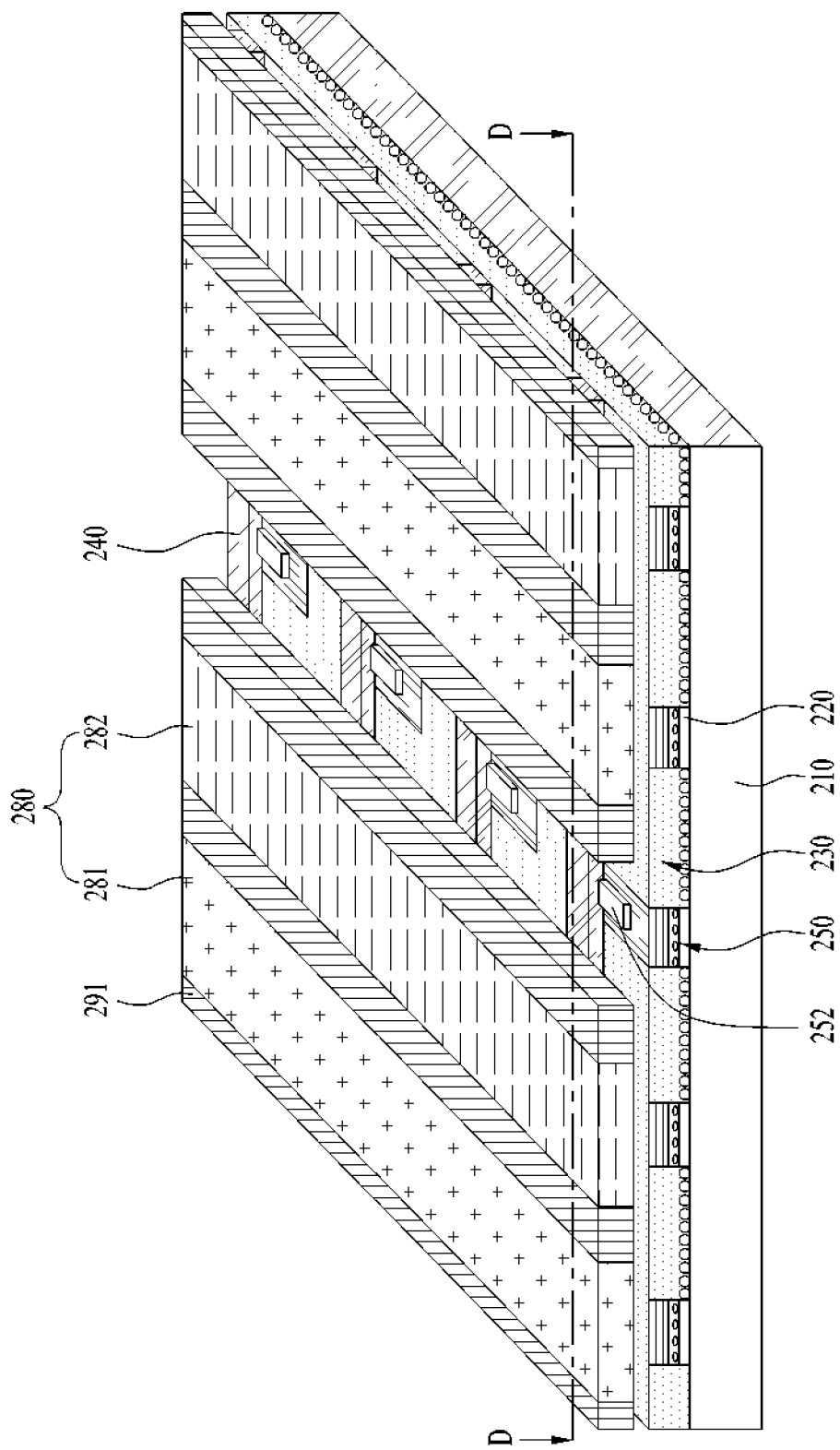
FIG. 7 is a perspective diagram of a display device using a semiconductor light emitting element according to another embodiment of the present disclosure.
Figure 8:
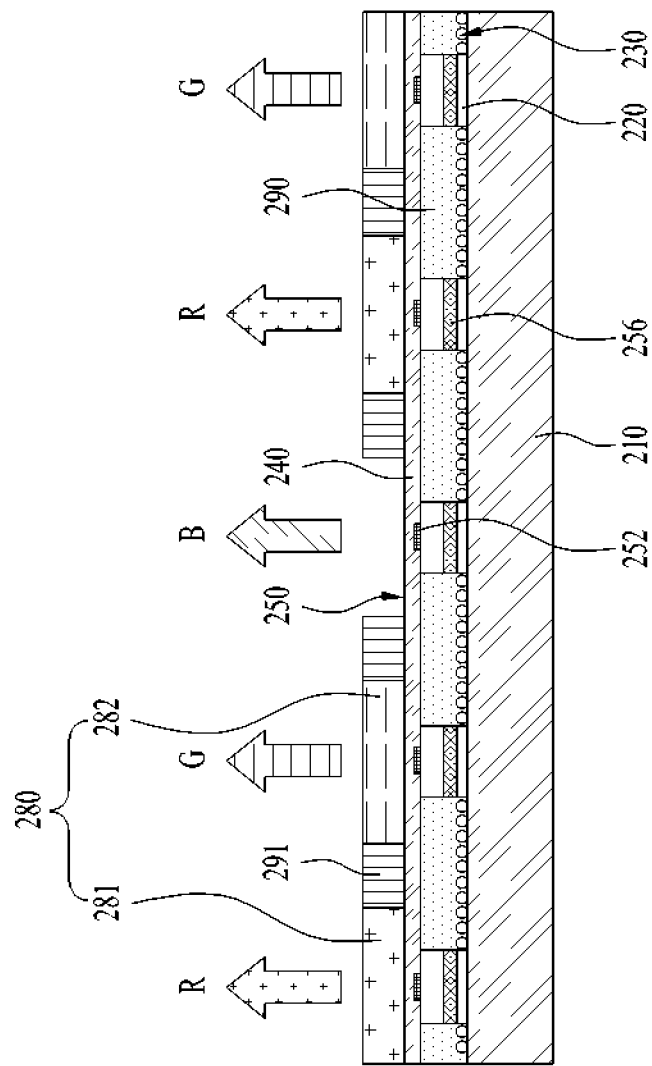
FIG. 8 is a cross-sectional diagram taken along a cutting line D-D shown in FIG. 8.
Figure 9:
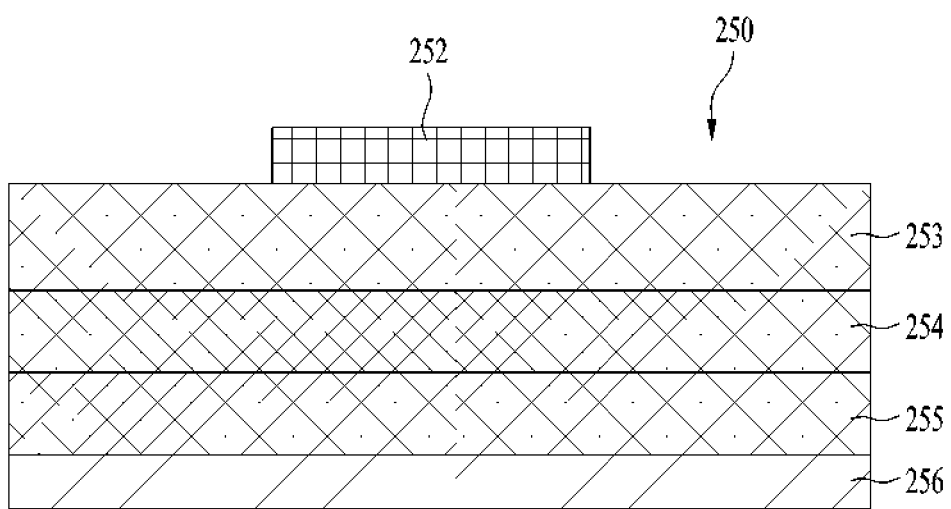
FIG. 9 is a conceptual diagram showing a vertical type semiconductor light emitting element shown in FIG. 8.

FIG. 7 is a perspective diagram of a display device using a semiconductor light emitting element according to another embodiment of the present disclosure, FIG. 8 is a cross-sectional diagram taken along a cutting line D-D shown in FIG. 8, and FIG. 9 is a conceptual diagram showing a vertical type semiconductor light emitting element shown in FIG. 8.

Referring to the present drawings, a display device may employ a vertical semiconductor light emitting device of a Passive Matrix (PM) type.

The display device includes a substrate 210, a first electrode 220, a conductive adhesive layer 230, a second electrode 240 and at least one semiconductor light emitting element 250.

The substrate 210 is a wiring substrate on which the first electrode 220 is disposed and may contain polyimide (PI) to implement a flexible display device. Besides, the substrate 210 may use any substance that is insulating and flexible.

The first electrode 210 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light emitting device of a flip chip type is applied, the conductive adhesive layer 230 may include one of an Anisotropic Conductive Film (ACF), an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220 is located on the substrate 210, if the semiconductor light emitting element 250 is connected by applying heat and pressure thereto, the semiconductor light emitting element 250 is electrically connected to the first electrode 220. In doing so, the semiconductor light emitting element 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light emitting element 250 and the first electrode 220 as well as mechanical connection.

Thus, the semiconductor light emitting element 250 is located on the conductive adhesive layer 230, via which an individual pixel is configured in the display device. As the semiconductor light emitting element 250 has excellent luminance, an individual unit pixel may be configured in small size as well. Regarding a size of the individual semiconductor light emitting element 250, a length of one side may be equal to or smaller than 80 μm for example and the individual semiconductor light emitting element 250 may include a rectangular or square element. For example, the rectangular element may have a size equal to or smaller than 20 μm×80 PM.

The semiconductor light emitting element 250 may have a vertical structure.

Among the vertical type semiconductor light emitting elements, a plurality of second electrodes 240 respectively and electrically connected to the vertical type semiconductor light emitting elements 250 are located in a manner of being disposed in a direction crossing with a length direction of the first electrode 220.

Referring to FIG. 9, the vertical type semiconductor light emitting element 250 includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240 described later. Since such a vertical type semiconductor light emitting element 250 can dispose the electrodes at top and bottom, it is considerably advantageous in reducing a chip size.

Referring to FIG. 8 again, a phosphor layer 280 may formed on one side of the semiconductor light emitting element 250. For example, the semiconductor light emitting element 250 may include a blue semiconductor light emitting element 251 emitting blue (B) light, and a phosphor layer 280 for converting the blue (B) light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red (R) light may be stacked on a blue semiconductor light emitting element. At a location of configuring a green unit pixel, the green phosphor 282 capable of converting blue light into green (G) light may be stacked on the blue semiconductor light emitting element. Moreover, the blue semiconductor light emitting element may be singly usable for a portion that configures a blue unit pixel. In this case, the unit pixels of red (R), green (G) and blue (B) may configure a single pixel.

Yet, the present disclosure is non-limited by the above description. In a display device to which a light emitting element of a flip chip type is applied, as described above, a different structure for implementing blue, red and green may be applicable.

Regarding the present embodiment again, the second electrode 240 is located between the semiconductor light emitting elements 250 and connected to the semiconductor light emitting elements electrically. For example, the semiconductor light emitting elements 250 are disposed in a plurality of columns, and the second electrode 240 may be located between the columns of the semiconductor light emitting elements 250.

Since a distance between the semiconductor light emitting elements 250 configuring the individual pixel is sufficiently long, the second electrode 240 may be located between the semiconductor light emitting elements 250.

The second electrode 240 may be formed as an electrode of a bar type that is long in one direction and disposed in a direction vertical to the first electrode.

In addition, the second electrode 240 and the semiconductor light emitting element 250 may be electrically connected to each other by a connecting electrode protruding from the second electrode 240. Particularly, the connecting electrode may include a n-type electrode of the semiconductor light emitting element 250. For example, the n-type electrode is formed as an ohmic electrode for ohmic contact, and the second electrode covers at least one portion of the ohmic electrode by printing or deposition. Thus, the second electrode 240 and the n-type electrode of the semiconductor light emitting element 250 may be electrically connected to each other.

Referring to FIG. 8 again, the second electrode 240 may be located on the conductive adhesive layer 230. In some cases, a transparent insulating layer (not shown) containing silicon oxide (SiOx) and the like may be formed on the substrate 210 having the semiconductor light emitting element 250 formed thereon. If the second electrode 240 is placed after the transparent insulating layer has been formed, the second electrode 240 is located on the transparent insulating layer. Alternatively, the second electrode 240 may be formed in a manner of being spaced apart from the conductive adhesive layer 230 or the transparent insulating layer.

If a transparent electrode of Indium Tin Oxide (ITO) or the like is sued to place the second electrode 240 on the semiconductor light emitting element 250, there is a problem that ITO substance has poor adhesiveness to an n-type semiconductor layer. Therefore, according to the present disclosure, as the second electrode 240 is placed between the semiconductor light emitting elements 250, it is advantageous in that a transparent electrode of ITO is not used. Thus, light extraction efficiency can be improved using a conductive substance having good adhesiveness to an n-type semiconductor layer as a horizontal electrode without restriction on transparent substance selection.

Referring to FIG. 8 again, a partition 290 may be located between the semiconductor light emitting elements 250. Namely, in order to isolate the semiconductor light emitting element 250 configuring the individual pixel, the partition 290 may be disposed between the vertical type semiconductor light emitting elements 250. In this case, the partition 290 may play a role in separating the individual unit pixels from each other and be formed with the conductive adhesive layer 230 as an integral part. For example, by inserting the semiconductor light emitting element 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 190. The partition 290 may include a black or white insulator depending on the purpose of the display device.

In case that the second electrode 240 is located right onto the conductive adhesive layer 230 between the semiconductor light emitting elements 250, the partition 290 may be located between the vertical type semiconductor light emitting element 250 and the second electrode 240 each. Therefore, an individual unit pixel may be configured using the semiconductor light emitting element 250. Since a distance between the semiconductor light emitting elements 250 is sufficiently long, the second electrode 240 can be placed between the semiconductor light emitting elements 250. And, it may bring an effect of implementing a flexible display device having HD image quality.

In addition, as shown in FIG. 8, a black matrix 291 may be disposed between the respective phosphors for the contrast ratio improvement. Namely, the black matrix 291 may improve the contrast between light and shade.

Figure 10:
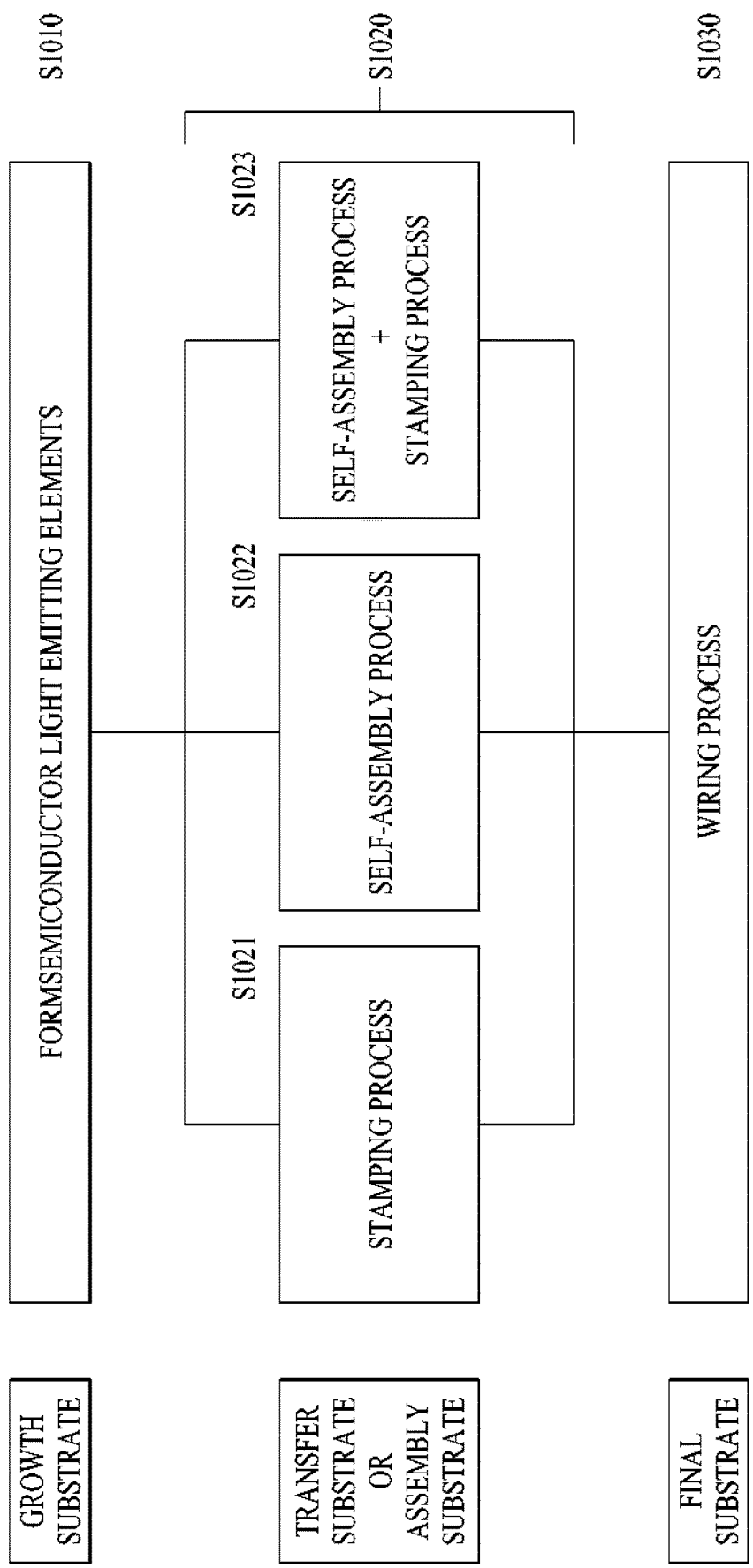
FIG. 10 is a diagram schematically illustrating a method for manufacturing a display device using a semiconductor light emitting element.

FIG. 10 is a diagram schematically illustrating a method for manufacturing a display device using a semiconductor light emitting element.

First, the semiconductor light emitting elements are formed on the growing substrate (S1010). The semiconductor light emitting elements may include a first conductivity type semiconductor layer, an active layer, and a second conductivity type semiconductor layer. In addition, a first conductivity type electrode formed on the first conductivity type semiconductor layer and a second conductivity type electrode formed on the second conductivity type semiconductor layer may be further included.

The semiconductor light emitting elements may be a horizontal type semiconductor light emitting element or the vertical type semiconductor light emitting element. However, in the case of the vertical type semiconductor light emitting element, because the first conductivity type electrode and the second conductivity type electrode face each other, a process of separating the semiconductor light emitting element from the growing substrate and forming a conductivity type electrode in one direction is added in a subsequent process. In addition, as will be described later, the semiconductor light emitting element may include a magnetic layer for a self-assembly process.

In order to utilize the semiconductor light emitting elements in the display device, in general, three types of semiconductor light emitting elements that emit light of colors corresponding to red (R), green (G), and blue (B) are required. Because semiconductor light emitting elements emitting light of one color are formed on one growing substrate, a separate substrate is required for the display device that implements individual unit pixels using the three types of semiconductor light emitting elements. Therefore, individual semiconductor light emitting elements must be separated from the growing substrate and assembled or transferred onto a final substrate. The final substrate is a substrate on which a process of forming a wiring electrode for applying a voltage to the semiconductor light emitting element such that the semiconductor light emitting element may emit light is performed.

Therefore, the semiconductor light emitting elements emitting the light of the respective colors may be transferred back to the final substrate after moving to the transfer substrate or the assembly substrate (S1020). In some cases, when performing the wiring process directly on the transfer substrate or the assembly substrate, the transfer substrate or the assembly substrate serves as the final substrate.

The method (S1020) for disposing the semiconductor light emitting element on the transfer substrate or the assembly substrate may be roughly divided into three types.

A first type is a method (S1021) for moving the semiconductor light emitting element from the growing substrate to the transfer substrate by the stamp process. The stamp process refers to a process of separating the semiconductor light emitting element from the growing substrate through a protrusion using a substrate that is made of a flexible material and having the adhesive protrusion. By adjusting a spacing and an arrangement of the protrusions, the semiconductor light emitting element of the growing substrate may be selectively separated.

A second type is a method (S1022) for assembling the semiconductor light emitting element onto the assembly substrate using the self-assembly process. For the self-assembly process, the semiconductor light emitting element must exist independently by being separated from the growing substrate, so that the semiconductor light emitting elements are separated from the growing substrate through a laser lift-off (LLO) process or the like as much as the required number of semiconductor light emitting elements. Thereafter, the semiconductor light emitting elements are dispersed in a fluid and assembled onto the assembly substrate using an electromagnetic field.

The self-assembly process may simultaneously assemble the semiconductor light emitting elements that respectively implement the R, G, and B colors on one assembly substrate, or assemble the semiconductor light emitting element of the individual color through an individual assembly substrate.

A third type is a method (S1023) for mixing the stamp process and the self-assembly process. First, the semiconductor light emitting elements are placed on the assembly substrate through the self-assembly process, and then the semiconductor light emitting elements are moved to the final substrate through the stamp process. In the case of the assembly substrate, because it is difficult to implement the assembly substrate in a large area due to a location of the assembly substrate during the self-assembly process, a contact with the fluid, an influence of the electromagnetic fields, or the like, a process of transferring the semiconductor light emitting elements to the final substrate of a large area after assembling the semiconductor light emitting elements using an assembly substrate of an appropriate area may be performed several times with the stamp process.

When a plurality of semiconductor light emitting elements constituting the individual unit pixel are placed on the final substrate, the wiring process for electrically connecting the semiconductor light emitting elements to each other is performed (S1030).

The wiring electrode formed through the wiring process electrically connects the semiconductor light emitting elements assembled or transferred onto the substrate to the substrate. In addition, a transistor for driving an active matrix may be previously formed beneath the substrate. Accordingly, the wiring electrode may be electrically connected to the transistor.

In one example, innumerable semiconductor light emitting elements are required for a large-area display device, so that the self-assembly process is preferable. In order to further improve an assembly speed, among the self-assembly processes, it may be preferred that the semiconductor light emitting elements of the respective colors are simultaneously assembled onto one assembly substrate. In addition, in order for the semiconductor light emitting elements of the respective colors to be assembled at predetermined specific positions on the assembly substrate, it may be required for the semiconductor light emitting elements to have a mutually exclusive structure.

Figure 11:
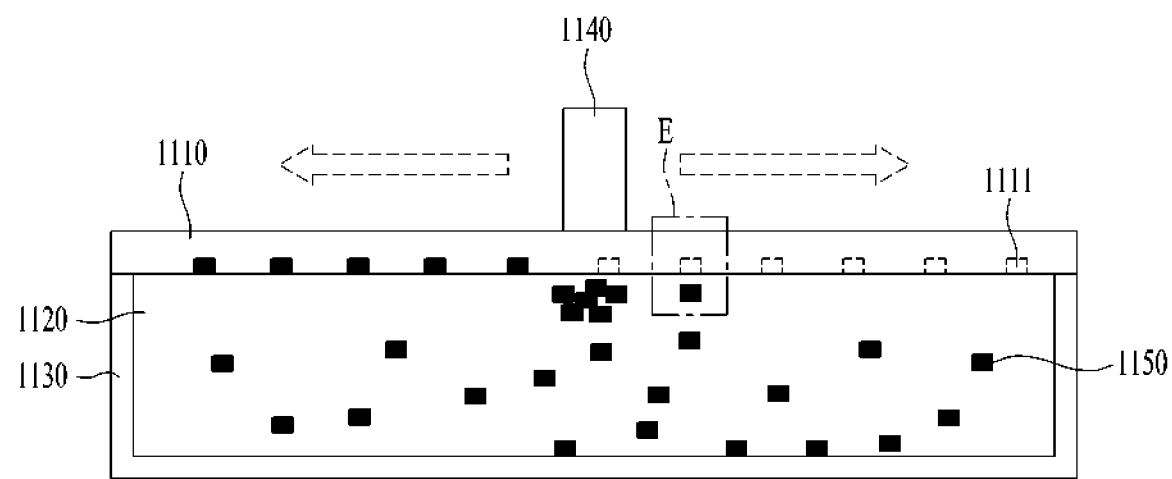
FIG. 11 is a diagram showing one embodiment of a method for assembling a semiconductor light emitting element onto a substrate by a self-assembly process.

FIG. 11 is a diagram showing one embodiment of a method for assembling a semiconductor light emitting element onto a substrate by a self-assembly process.

Figure 12:
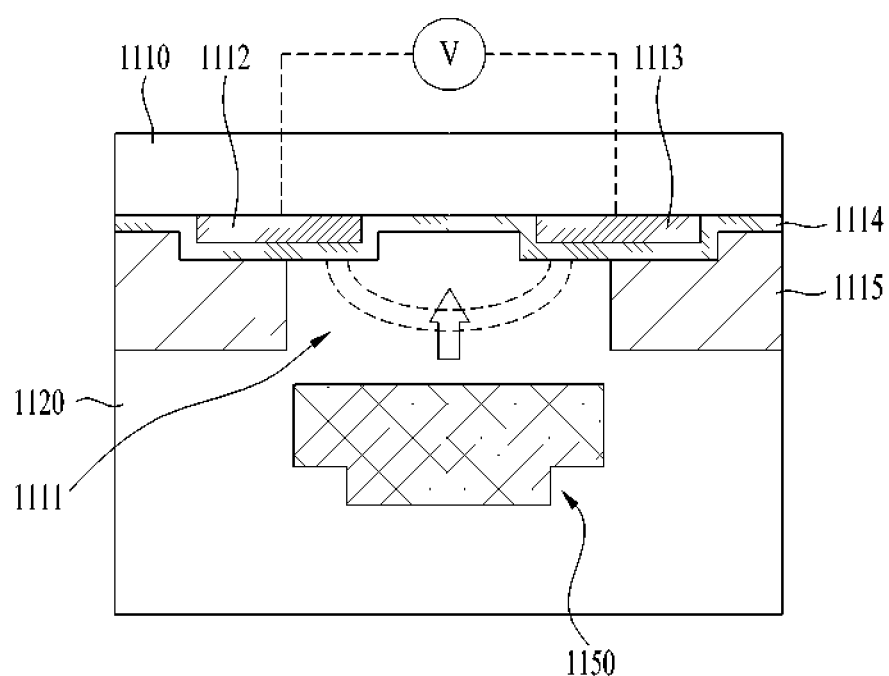
FIG. 12 is an enlarged view of a portion E in FIG. 11.

FIG. 12 is an enlarged view of a portion E in FIG. 11.

Referring to FIGS. 11 and 12, a semiconductor light emitting element 1150 may be input into a chamber 1130 filled with a fluid 1120.

Thereafter, the assembly substrate 1110 may be disposed on the chamber 1130. According to an embodiment, the assembly substrate 1110 may be introduced into the chamber 1130. In this regard, a direction in which the assembly substrate 1110 is introduced is a direction in which an assembly groove 1111 of the assembly substrate 1110 faces the fluid 1120.

A pair of electrodes 1112 and 1113 corresponding to each semiconductor light emitting element 1150 to be assembled may be formed on the assembly substrate 1110. The electrodes 1112 and 1113 may be implemented as transparent electrodes (ITO) or may be implemented using other common materials. The electrodes 1112 and 1113 correspond to assembly electrodes that stably fix the semiconductor light emitting element 1150 in contact with the assembly electrodes 1112 and 1113 by generating an electric field as a voltage is applied thereto.

Specifically, an alternating voltage may be applied to the electrodes 1112 and 1113, and the semiconductor light emitting element 1150 floating around the electrodes 1112 and 1113 may have a polarity by dielectric polarization. In addition, the dielectrically polarized semiconductor light emitting element may be moved in a specific direction or fixed by a non-uniform electric field formed around the electrodes 1112 and 1113. This is referred to as dielectrophoresis. In a self-assembly process of the present disclosure, the semiconductor light emitting element 1150 may be stably fixed into the assembly groove 1111 using the dielectrophoresis.

In addition, a spacing between the assembly electrodes 1112 and 1113 may be, for example, smaller than a width of the semiconductor light emitting element 1150 and a diameter of the assembly groove 1111, so that an assembly position of the semiconductor light emitting element 1150 using the electric field may be more precisely fixed.

In addition, an assembly insulating layer 1114 may be formed on the assembly electrodes 1112 and 1113 to protect the electrodes 1112 and 1113 from the fluid 1120 and to prevent leakage of current flowing through the assembly electrodes 1112 and 1113. For example, the assembled insulating film 1114 may be composed of a single layer or multiple layers of an inorganic insulator such as silica or alumina or an organic insulator. In addition, the assembly insulating layer 1114 may have a minimum thickness for preventing damage to the assembly electrodes 1112 and 1113 when assembling the semiconductor light emitting element 1150 and may have a maximum thickness for stably assembling the semiconductor light emitting element 1150.

A partition wall 1115 may be formed on the assembly insulating layer 1114. A partial region of the partition wall 1115 may be located above the assembly electrodes 1112 and 1113, and the remaining region thereof may be located above the assembly substrate 1110.

For example, when manufacturing the assembly substrate 1110, as a portion of the partition wall formed on the entire assembly insulating layer 1114 is removed, the assembly groove 1111 in which each of the semiconductor light emitting elements 1150 is coupled to the assembly substrate 1110 may be defined.

As shown in FIG. 12, the assembly groove 1111 into which the semiconductor light emitting element 1150 is coupled may be defined in the assembly substrate 1110 and a surface in which the assembly groove 1111 is defined may be in contact with the fluid 1120. The assembly groove 1111 may guide the accurate assembly position of the semiconductor light emitting element 1150.

In addition, the partition wall 1115 may be formed to have a certain inclination from an opening of the assembly groove 1111 toward a bottom surface. For example, by adjusting the inclination of the partition wall 1115, the assembly groove 1111 may have the opening and the bottom surface and an area of the opening may be larger than an area of the bottom surface. Accordingly, the semiconductor light emitting element 1150 may be assembled at an accurate position on the bottom surface of the assembly groove 1111.

The assembly groove 1111 may have a shape and a size corresponding to those of the semiconductor light emitting element 1150 to be assembled. Accordingly, it is possible to prevent other semiconductor light emitting elements from being assembled into the assembly groove 1111 or to prevent a plurality of semiconductor light emitting elements from being assembled into the assembly groove 1111.

In addition, a depth of the assembly groove 1111 may be smaller than a vertical height of the semiconductor light emitting element 1150. Therefore, the semiconductor light emitting element 1150 may have a structure protruding to a portion between the portions of the partition walls 1115, and may easily come into contact with a protrusion of the transfer substrate during a transfer process that may occur after the assembly.

In addition, as shown in FIG. 11, after the assembly substrate 1110 is disposed, an assembly apparatus 1140 containing a magnetic body may move along the assembly substrate 1110. The assembly apparatus 1140 may move in contact with the assembly substrate 1110 in order to maximize a region of a magnetic field into the fluid 1120. For example, the assembly apparatus 1140 may contain a plurality of magnetic bodies or may contain a magnetic body of a size corresponding to that of the assembly substrate 1110. In this case, a moving distance of the assembly apparatus 1140 may be limited to be in a predetermined range.

The semiconductor light emitting element 1150 in the chamber 1130 may move toward the assembly apparatus 1140 by the magnetic field generated by the assembly apparatus 1140.

While moving toward the assembly apparatus 1140, the semiconductor light emitting element 1150 may enter the assembly groove 1111 and come into contact with the assembly substrate 1110, as shown in FIG. 12.

In addition, the semiconductor light emitting element 1150 may include a magnetic layer therein such that the self-assembly process may be performed.

The semiconductor light emitting element 1150 in contact with the assembly substrate 1110 may be prevented from deviating by the movement of the assembly device 1140 because of the electric field generated by the assembly electrodes 1112 and 1113 of the assembly substrate 1110.

Accordingly, the plurality of semiconductor light emitting elements 1150 are simultaneously assembled to the assembly substrate 1110 in the self-assembly method using the electromagnetic field shown in FIGS. 11 and 12.

Figure 13:
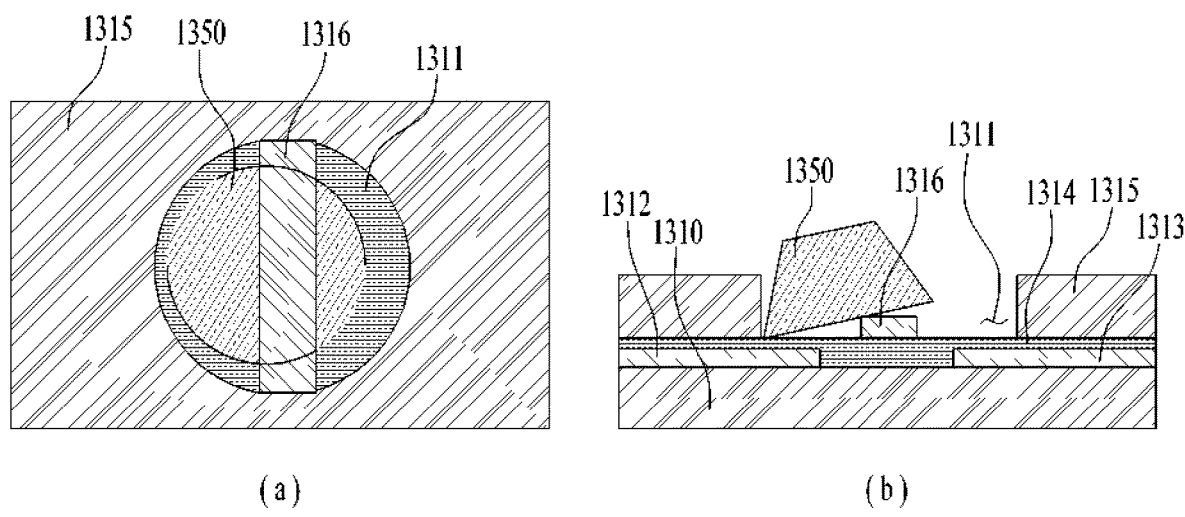
FIG. 13 is an embodiment of a case in which a general vertical type semiconductor light emitting element is assembled onto an assembly substrate.

FIG. 13 is an embodiment of a case in which a general vertical type semiconductor light emitting element is assembled onto an assembly substrate.

In general, in a case of a horizontal type semiconductor light emitting element, an element is assembled onto a substrate by the self-assembly method described with reference to FIGS. 11 and 12, and then a process of forming a wiring electrode to be connected to each conductivity-type electrode on one surface of the element is performed.

On the other hand, in the case of the vertical type semiconductor light emitting element, the conductivity-type electrodes are respectively formed on both surfaces of the element. Therefore, when the semiconductor light emitting element is assembled onto the substrate, only a conductivity-type electrode on one surface is exposed on the substrate. Therefore, the wiring electrode may be formed in advance on the substrate for the electrical connection between the non-exposed conductivity-type electrode on the opposite surface and the substrate.

In FIG. 13, (a) is a plan view showing a partition wall 1315, an assembly groove 1311 defined by the partition wall 1315, a wiring electrode 1316 disposed on a bottom of the assembly groove 1311, and a semiconductor light emitting element 1350 assembled into the assembly groove 1311. For smooth assembly, an area of the assembly groove 1311 is larger than an assembly area of the semiconductor light emitting element 1350. Accordingly, the semiconductor light emitting element 1350 may be randomly positioned within the assembly groove 1311. The wiring electrode 1316 for electrical connection between the semiconductor light emitting element 1350 and the assembly substrate may exist in a form of one bar as shown in (a) of FIG. 13.

In FIG. 13, (b) shows a cross-sectional view of the semiconductor light emitting element 1350 assembled onto the assembly substrate in (a) of FIG. 13. The cross-sectional view exemplifies a case in which a defect has occurred. When it is normal for the semiconductor light emitting element 1350 to be horizontally directed on the assembly substrate, the semiconductor light emitting element 1350 may be assembled in a form inclined to one side as shown in (b) of FIG. 13. Alternatively, during a wiring process for electrical connection between the wiring electrode 1316 and the semiconductor light emitting element 1350, the wiring electrode 1316 may be melted and thermally flow, so that the position of the element may be changed.

Specifically, as shown in in (b) of FIG. 13, a pair of assembly electrodes 1312 and 1313 are located on the substrate 1310, and the assembly substrate 1310 includes a dielectric film 1314 for surrounding the assembly electrodes 1312 and 1313 and the partition wall 1315 for the assembly groove 1311. In addition, the wiring electrode 1316 electrically connected to the semiconductor light emitting element 1350 is positioned on the dielectric film 1314. The wiring electrode 1316 may be melted in the wiring process and may be electrically connected to the semiconductor light emitting element 1350 that comes into contact with the wiring electrode 1316. Accordingly, the wiring electrode 1316 may include a low-melting-point metal layer that is relatively easy to melt. A width of the wiring electrode 1316 may be smaller than a width of the semiconductor light emitting element 1350. This is because, when the width of the wiring electrode 1316 is greater than the width of the semiconductor light emitting element 1350, an electric field generated through the assembly electrodes 1312 and 1313 in the self-assembly process may be shielded by the wiring electrode 1316. In addition, in the wiring process, the wiring electrode 1316 may melt and flow, so that an excessive size of the wiring electrode may cause an unintended short-circuit defect in the thermal flow process. Accordingly, as shown in-FIG. 13A or 13B (a) of (b) of FIG. 13, the wiring electrode 1316 may be formed in a partial region of the assembly groove. However, in this case, as shown in (b) of FIG. 13, the semiconductor light emitting element 1350 assembled onto the assembly substrate may be inclined by the protruding wiring electrode 1316. Accordingly, a contact area with the wiring electrode 1316 may decrease, and thus a contact resistance may increase. In addition, assuming that the plurality of semiconductor light emitting elements are assembled onto the substrate, because the semiconductor light emitting elements have different areas of contact with the wiring electrode, actually applied voltages may be different, and thus a difference may occur in light emission uniformity.

In one example, in order to prevent the inclination of the element, it is possible to devise a structure in which the wiring electrode is embedded in the groove by additionally defining a separate groove in the bottom surface of the assembly groove without protruding the wiring electrode from the bottom surface of the assembly groove. However, in this case, it is difficult to secure reliability of whether the semiconductor light emitting element is in proper contact with the wiring electrode. Therefore, based on the structure in which the wiring electrode protrudes from the bottom surface of the assembly groove, a structure of the assembly substrate and the wiring electrode in which the semiconductor light emitting element is horizontally assembled on the wiring electrode and further the change in the position of the horizontally assembled semiconductor light emitting element is also minimized in the wiring process is required.

Accordingly, an assembly substrate having a wiring electrode for solving the above problems and a display device using the same will be described later in FIGS. 14 to 22.

Figure 14:
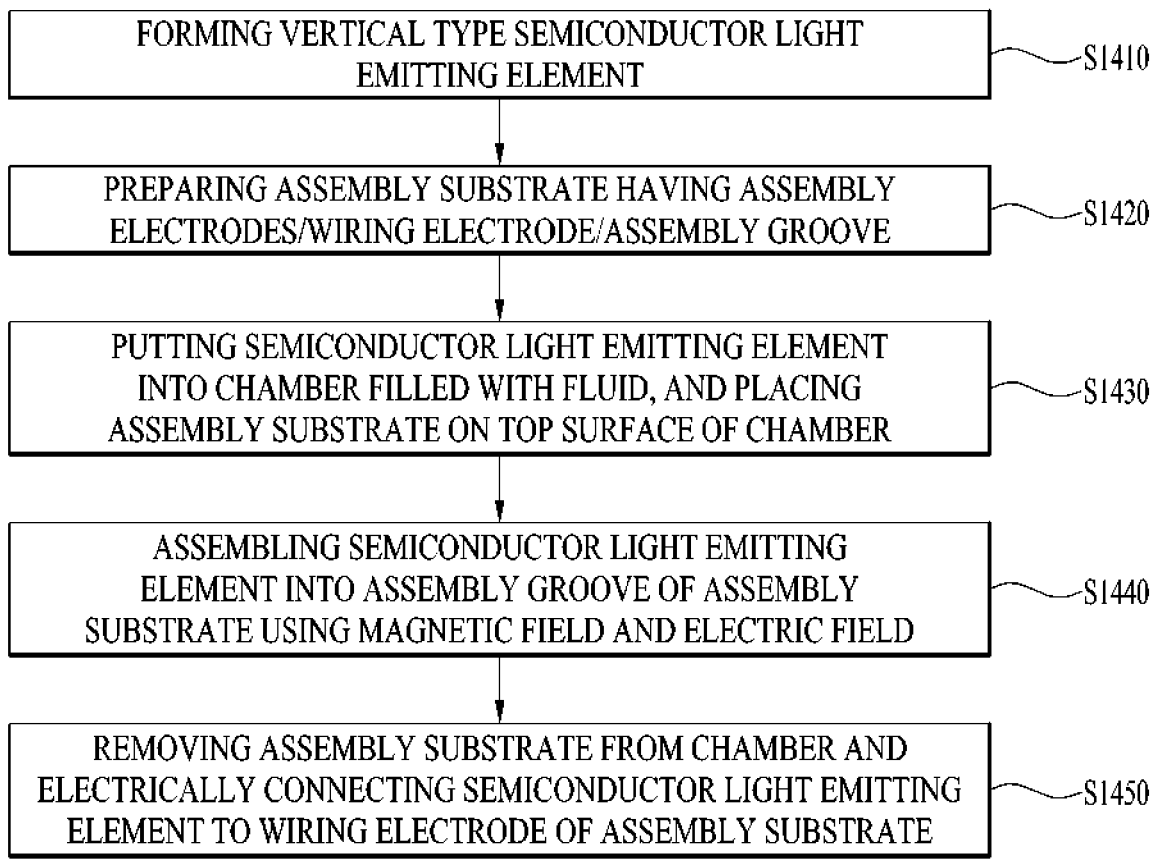
FIG. 14 is a flowchart schematically illustrating a method for manufacturing a display device using an assembly substrate of the present disclosure.

FIG. 14 is a flowchart schematically illustrating a method for manufacturing a display device using an assembly substrate of the present disclosure.

First, the vertical type semiconductor light emitting element is formed (S1410). The vertical type semiconductor light emitting element may have the conductivity-type electrodes respectively at both ends thereof. Therefore, a conductivity-type electrode at one end may be formed together in the process of forming the semiconductor light emitting structure on the growth substrate, and the remaining conductivity-type electrode may be formed after transferring the semiconductor light emitting element using a separate transfer substrate. The semiconductor light emitting element is self-assembled in the fluid using the magnetic field and the electric field, so that the element may include the magnetic layer.

Thereafter, the assembly substrate having the assembly electrodes, the wiring electrode, and the assembly groove is prepared (S1420). The assembly electrodes generate a dielectrophoretic force in a relationship with the semiconductor light emitting element by the electric field, and the wiring electrode electrically connects the vertical type semiconductor light emitting element to the substrate. In addition, the wiring electrode may be composed of a base electrode and a low-melting-point junction portion positioned on the base electrode. In addition, the assembly groove guides the position where the semiconductor light emitting element is assembled.

Thereafter, the vertical type semiconductor light emitting element is put into the chamber filled with the fluid, and the assembly substrate is placed on the top surface of the chamber (S1430).

Thereafter, as described above, the semiconductor light emitting element is assembled into the assembly groove of the assembly substrate using the magnetic field and the electric field (S1440).

Finally, the assembly substrate is removed from the chamber, and the semiconductor light emitting element is electrically connected to the wiring electrode of the assembly substrate (S1450). Therefore, the conductivity-type electrode at one end of the semiconductor light emitting element and the substrate are electrically connected to each other.

Furthermore, the additional wiring process may be performed for the conductivity-type electrode formed at the other end of the semiconductor light emitting element.

In view of the entire gist of the present specification, at a level that may be understood by those skilled in the art, deleting and changing some operations of the flowchart shown in FIG. 14 also fall within the scope of the present disclosure.

Figure 15:
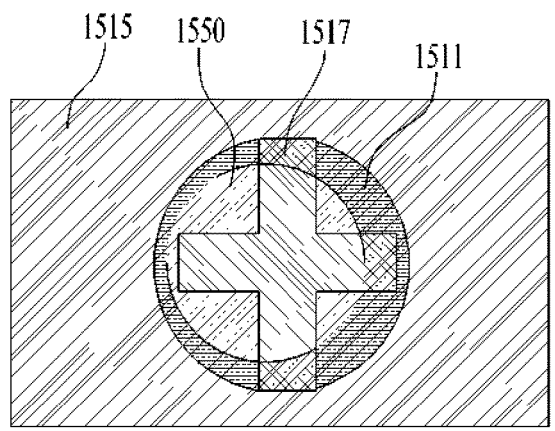
FIG. 15 illustrates views of a vertical type semiconductor light emitting element electrically connected to a wiring electrode of an assembly substrate of the present disclosure.
Figure 15:
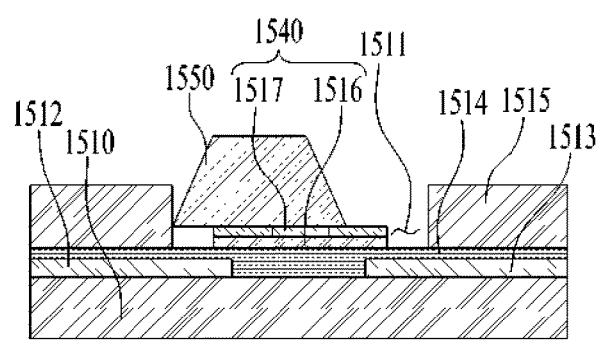

FIG. 15 illustrates views of a vertical type semiconductor light emitting element electrically connected to a wiring electrode of an assembly substrate of the present disclosure.

In FIG. 15, (a) is a plan view illustrating a partition wall 1515, an assembly groove 1511 defined by the partition wall 1515, a low-melting-point junction portion 1517 disposed on a bottom surface of the assembly groove 1511, and a semiconductor light emitting element 1550 assembled in the assembly groove 1511. For smooth assembly, an area of the assembly groove 1511 is larger than an assembly area of the semiconductor light emitting element 1550. Accordingly, the semiconductor light emitting element 1550 may be randomly positioned within the assembly groove 1511. The low-melting-point junction portion 1517 for electrical connection of the semiconductor light emitting element 1550 and the assembly substrate may have a form in which a plurality of bars intersect each other as shown in (a) of FIG. 15. The low-melting-point junction portion 1517 is formed on the base electrode. The wiring electrode of the present disclosure includes the low-melting-point junction portion 1517 and the base electrode. In addition, the low-melting-point junction portion 1517 may have a flow blocking angle at an intersection of the plurality of bars. As the flow blocking angle is formed at the intersection, when the low-melting-point junction portion 1517 is melted in the wiring process, a thermal flow amount of a corresponding region (the intersection) is smaller than those of other regions of the low-melting-point junction portion 1517. For example, the thermal flow amount of the intersection region having the flow blocking angle may be smaller than a thermal flow amount of ends of the plurality of bars. Therefore, when the low-melting-point junction portion 1517 expands or flows by heat, although a movement is relatively easy in a direction of the ends of the plurality of bars, it is difficult to flow to the intersection region with the flow blocking angle. This will be described in detail later with reference to FIG. 18.

In one example, (b) of FIG. 15 illustrates a cross-sectional view of the semiconductor light emitting element 1350 assembled onto the assembly substrate in (a) of FIG. 15. As may be seen from the cross-sectional view, the semiconductor light emitting element 1350 may be horizontally directed on the assembly substrate unlike in in (b) of FIG. 13.

Specifically, as shown in (b) of FIG. 15, a pair of assembly electrodes 1512 and 1513 are located on the assembly substrate 1510, and the assembly substrate includes a dielectric film 1514 surrounding the assembly electrodes 1512 and 1513 and the partition wall 1515 for the assembly groove 1511. In addition, a wiring electrode 1540 electrically connected to the semiconductor light emitting element 1550 is located on the dielectric film 1514. The wiring electrode 1540 may be composed of a base electrode 1516 and the low-melting-point junction portion 1517 formed on the base electrode 1516. In addition, the low-melting-point junction portion 1517 may include a metal layer that is melted at a temperature in a range from 100 and 250 degrees. Accordingly, after assembling the semiconductor light emitting element onto the assembly substrate, the low-melting-point junction portion 1517 may be melted in the wiring process to be electrically connected to the semiconductor light emitting element 1550. In addition, in order to apply a certain pressure to the semiconductor light emitting element 1550 in the wiring process, a height of the semiconductor light emitting element 1550 may be greater than a height of the partition wall 1515.

Figure 16:
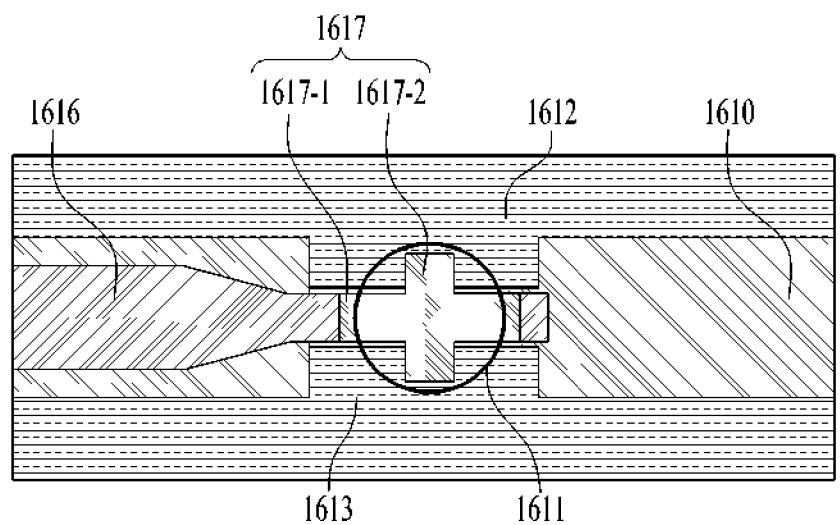
FIG. 16 illustrates embodiments of an assembly substrate including a wiring electrode of the present disclosure.
Figure 16:
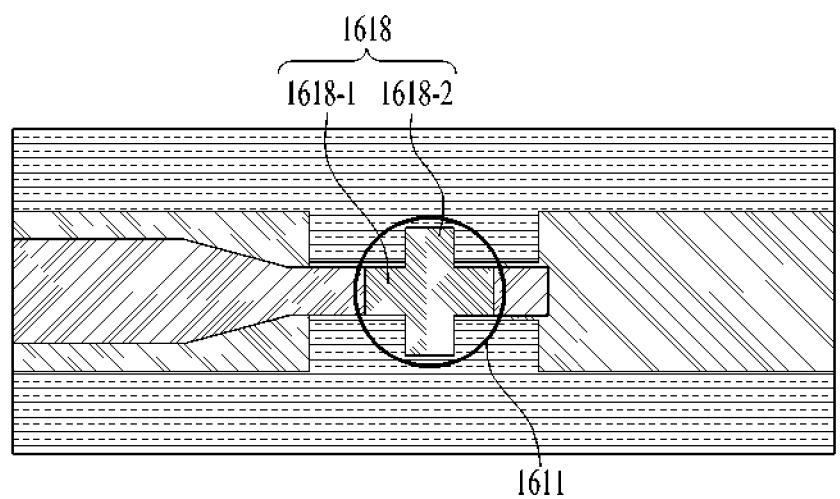

FIG. 16 illustrates embodiments of an assembly substrate including a wiring electrode of the present disclosure.

In FIG. 16, (a) and (b) are slightly different only in a structure of the low-melting-point junction portion and are the same in the remaining components. In addition, in order to more clearly observe structures and shapes of the assembly electrode and the wiring electrode, the dielectric film and the partition wall positioned between the assembly electrode and the wiring electrode are omitted.

As shown in (a) of FIG. 16, a pair of assembly electrodes 1612 and 1613 may be positioned on a substrate 1610, and a wiring electrode may be positioned therebetween. The pair of assembly electrodes 1612 and 1613 are for applying the electric field, and are able to generate the dielectrophoretic force with the semiconductor light emitting element when applied with the alternating voltage. The assembly electrodes 1612 and 1613 may partially protrude to be positioned to overlap an assembly groove 1611 in which the semiconductor light emitting element is assembled as shown in (a) of FIG. 16. However, the present disclosure is not limited thereto, and it is also possible that the assembly electrodes 1612 and 1613 are arranged side by side in a straight line. In one example, the wiring electrode may be positioned between the assembly electrodes 1612 and 1613. A base electrode 1616 may be directed in the same direction as the direction in which the assembly electrodes 1612 and 1613 are directed, and a low-melting-point junction portion 1617 may be positioned on a bottom surface of the assembly groove 16111.

Specifically, the low-melting-point junction portion 1617 may be positioned on the base electrode 1616 and formed in a form of a plurality of intersecting bars. For example, the low-melting-point junction portion 1617 may include a first bar 1617-1 directed in a first direction and a second bar 1617-2 directed in a second direction intersecting the first direction. In addition, as shown in (a) of FIG. 16, the first direction may correspond to a long axis direction of the base electrode 1616 of the wiring electrode, and a length of the first bar 1617-1 may be larger than a diameter of the assembly groove 1611. As the first bar 1617-1 is formed to be larger than the assembly groove 1611, the semiconductor light emitting element that is primarily assembled into the assembly groove 1611 may be prevented from being inclined in the first direction.

In addition, certain regions of both ends of the second bar 1617-2 may be positioned to overlap the assembly electrodes 1612 and 1613, respectively. As described above, the assembly electrodes 1612 and 1613 may partially overlap the assembly groove 1611, so that, when a length of the second bar 1617-2 is similar to the diameter of the assembly groove 1611, the certain regions of the both ends of the second bar 1617-2 may be positioned to overlap the assembly electrodes 1612 and 1613, respectively. Therefore, the semiconductor light emitting element assembled into the assembly groove 1611 may be prevented from being inclined in the second direction. In the present disclosure, the semiconductor light emitting element is horizontally assembled onto the assembly substrate while minimizing an area of the low-melting-point junction portion through the intersection of the bars. As described above, when the area of the low-melting-point junction portion is similar to the area of the assembly groove, a degree of melting and deformation of the junction portion becomes great in the subsequent wiring process, which may cause the change in the position of the element or the short-circuit defect. Thus, the area of the low-melting-point junction portion should be considered in terms of efficiency.

In one example, (b) of FIG. 16 is a view showing a case in which a low-melting-point junction portion 1618 on the base electrode 1616 is formed only in the assembly groove 1611. The first bar 1617-1 of the low-melting-point junction portion 1617 is formed longer than the assembly groove 1611 in (a) of FIG. 16, but both a first bar 1618-1 and a second bar 1618-2 are formed in the assembly groove 1611 in FIG. 16B (b) of FIG. 16. However, even in this case, the closer the lengths of the first bar 1618-1 and the second bar 1618-2 are to the diameter of the assembly groove 1611, the more advantageous it is for the horizontal assembly of the semiconductor light emitting element.

However, in FIG. 16, the length of the first bar of the low-melting-point junction portion is expressed differently in consideration of a process level. As the assembly groove becomes smaller, the spacing between the assembly electrodes overlapping the assembly groove and the width of the first bar positioned between the assembly electrodes may decrease. When it is possible to form the first bar with a desired width in the assembly groove in consideration of the process level, it may be advantageous for all regions of the low-melting-point junction portion to be located in the assembly groove as shown in (b) of FIG. 16. However, realistically, when it is difficult to fine-tune the width of the low-melting-point junction portion corresponding to the spacing between the assembled electrodes, it is easy in the process to form some bars long and the remaining bars short. In this case, it may be advantageous that, rather than the second bar, the first bar formed in the same direction as the base electrode has the length greater than the diameter of the assembly groove.

In one example, in FIG. 16, two bars may be expressed as intersecting, and a plurality of bars other than the two bars may constitute the low-melting-point junction portion. Even in this case, the area of the low-melting-point junction portion compared to the area of the assembly groove should be considered in terms of the efficiency.

Figure 17:
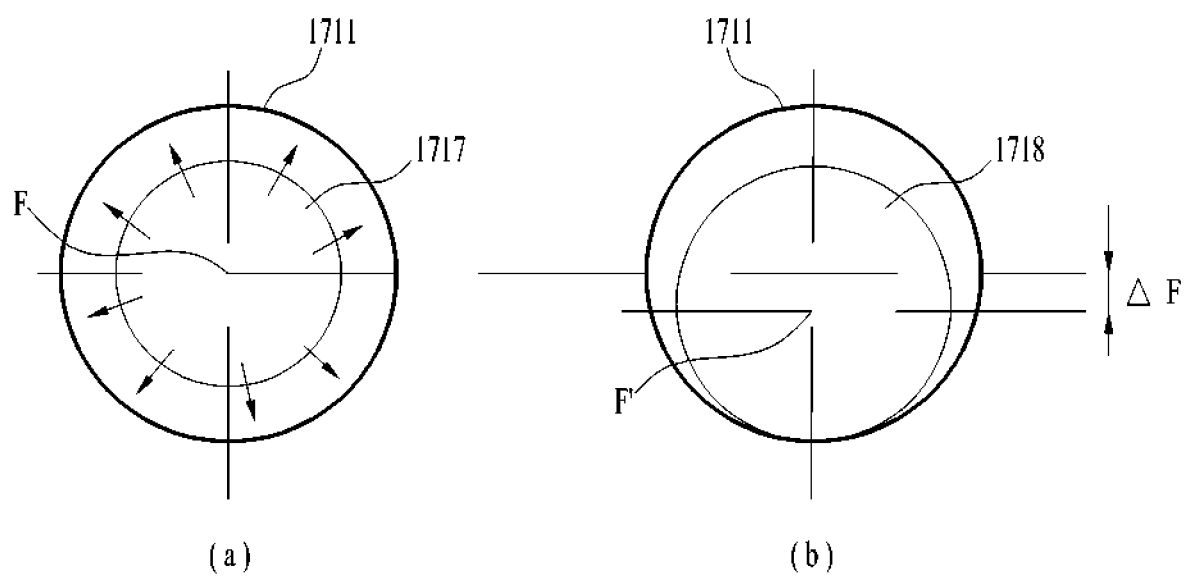
FIG. 17 illustrates views of a general shape change before and after a wiring process of a wiring electrode of an assembly substrate.

FIG. 17 illustrates views of a general shape change before and after a wiring process of a wiring electrode of an assembly substrate.

In FIG. 17, (a) may be a general shape of a low-melting-point junction portion 1717 formed on the base electrode of the wiring electrode. In addition, a center point F of the low-melting-point junction portion 1717 may coincide with a center point of an assembly groove 1711. As shown in (a) of FIG. 17, when the low-melting-point junction portion 1717 is formed in a circular shape without a specific directionality, the semiconductor light emitting element to be in contact with the low-melting-point junction portion 1717 later may be directed horizontally. However, during the wiring process, the low-melting-point junction portion 1717 may flow in a random direction as shown by an arrow in (a) of FIG. 17.

In FIG. 17, (b) is a simple illustration of a shape that a low-melting-point junction portion 1718 in the assembly groove 1711 after the wiring process may have. The low-melting-point junction portion 1718 is melted in the wiring process and is able to expand or flow, so that the low-melting-point junction portion 1718 may come into contact with one side surface of the assembly groove 1711 as shown in (B) OF FIG. 17. In this case, a position change by ΔF may occur on a center point F' of the low-melting-point junction portion 1718 from the center point F of the low-melting-point junction portion 1717 before the wiring process. Therefore, when the semiconductor light emitting element is assembled on the low-melting-point junction portion, after the wiring process, the structure of the semiconductor light emitting element may change from the existing horizontal structure to an inclined structure due to the position change ΔF.

In the vertical type semiconductor light emitting element, the wiring process for electrically connecting the assembly substrate with the conductivity-type electrode of the semiconductor light emitting element to be in contact with the substrate is essential. For example, an operation of placing the low-melting-point metal layer on the substrate and then melting the low-melting-point metal layer to be electrically connected to the element is performed. Therefore, even the semiconductor light emitting element assembled horizontally onto the substrate may become inclined due to the deformation of the low-melting-point metal layer after the wiring process. In order to prevent this, a structure capable of controlling the position change of the low-melting-point metal layer even when the wiring process is performed is required.

Figure 18:
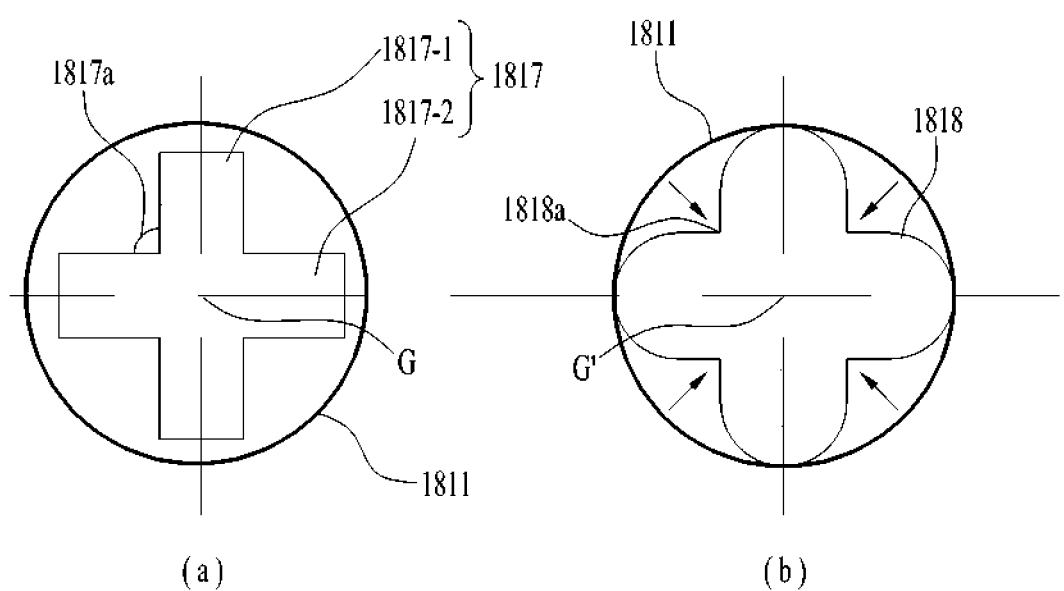
FIG. 18 illustrates views showing a shape change before and after a wiring process of a low-melting-point junction portion formed on a base electrode of an assembly substrate of the present disclosure.

FIG. 18 illustrates views showing a shape change before and after a wiring process of a low-melting-point junction portion formed on a wiring electrode of an assembly substrate of the present disclosure.

In FIG. 18, (a) is a view illustrating a shape in which a low-melting-point junction portion 1817 having a first bar 1817-1 and a second bar 1817-2 intersecting the first bar 1817-1 is located in an assembly groove 1811. The first bar 1817-1 and the second bar 1817-2 may intersect each other at a center point G of the assembly groove 1811. In addition, an intersection of the first bar 1817-1 and the second bar 1817-2 may have a flow blocking angle 1817a. The flow blocking angle may be equal to or smaller than 90 degrees. The case in (a) of FIG. 18 is a case in which the second bar 1817-2 vertically intersects the first bar 1817-1. In this case, the flow blocking angle 1817a may be 90 degrees. In one example, when the semiconductor light emitting element is assembled in the assembly groove 1811 in the future, the intersection at which the flow blocking angle 1817a is formed may overlap one surface of the semiconductor light emitting element. That is, the intersection of the low-melting-point junction portion 1817 at which the flow blocking angle 1817a is formed may be located in a region within the assembly area of the semiconductor light emitting element.

In FIG. 18, (b) is a view illustrating a shape of the low-melting-point junction portion 1817 in (a) of FIG. 18 after performing the wiring process. A low-melting-point junction portion 1818 after the wiring process may expand or flow in the assembly groove 1811, so that a shape thereof may be deformed. However, as a flow blocking angle 1818a is defined in an intersection region of the plurality of bars, the deformation of the low-melting-point junction portion 1818 in the region may be minimized. This is because, when the low-melting-point junction portion is melted, a thermal flow amount of the intersection region with the flow blocking angle is smaller than that of an end of the bar of the low-melting-point junction portion. Therefore, as shown in (b) of FIG. 18, even when the wiring process is performed, an amount of deformation of the region with the flow blocking angle 1818a is small. In addition, because the low-melting-point junction portion 1818 has the symmetrical flow blocking angles 1818a as indicated by arrows, even after the wiring process, a center of the low-melting-point junction portion 1818 may be located at the center point G of the assembly groove 1811 in the same manner. That is, even when the semiconductor light emitting element is positioned on the low-melting-point junction portion 1818, the position change before and after the wiring process may be minimized. Therefore, the semiconductor light emitting element horizontally assembled onto the substrate may still be directed horizontally on the substrate even when the wiring process is performed. Therefore, in the present disclosure, the flow blocking angle was formed by intersecting the plurality of bars with each other to minimize the position change of the low-melting-point junction portion in the wiring process. In addition, the flow blocking angles are symmetrical within the low-melting-point junction portion, so that it is possible to more effectively suppress the position change of the low-melting-point junction portion.

Figure 19:
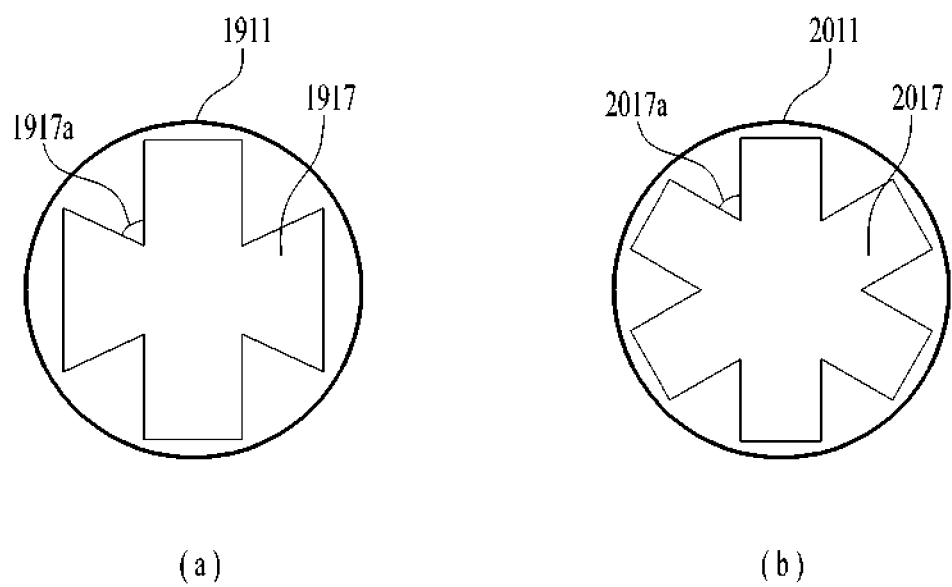
FIG. 19 illustrates embodiments of a low-melting-point junction portion of various shapes.

FIG. 19 illustrates embodiments of a low-melting-point junction portion of various shapes.

In FIG. 19, (a) is a view illustrating a low-melting-point junction portion 1917 in which a polygonal structure is coupled to one straight bar shape within an assembly groove 1911. As shown in (a) of FIG. 19, flow blocking angles 1917a formed through the shape may be symmetrical in the low-melting-point junction portion 1917, and may also be smaller than 90 degrees.

In addition, (b) of FIG. 19 is a view illustrating a low-melting-point junction portion 2017 formed by intersecting three straight bars in an assembly groove 2011. As shown in (b) of FIG. 19, flow blocking angles 2017a formed through the shape may be symmetrical in the low-melting-point junction portion 2017 and may also be smaller than 90 degrees.

As such, one of the technical features of the present disclosure is that the low-melting-point junction portion having the flow blocking angle is included, but the present disclosure is not specifically limited by the number and the shape of the bars.

Figure 20:
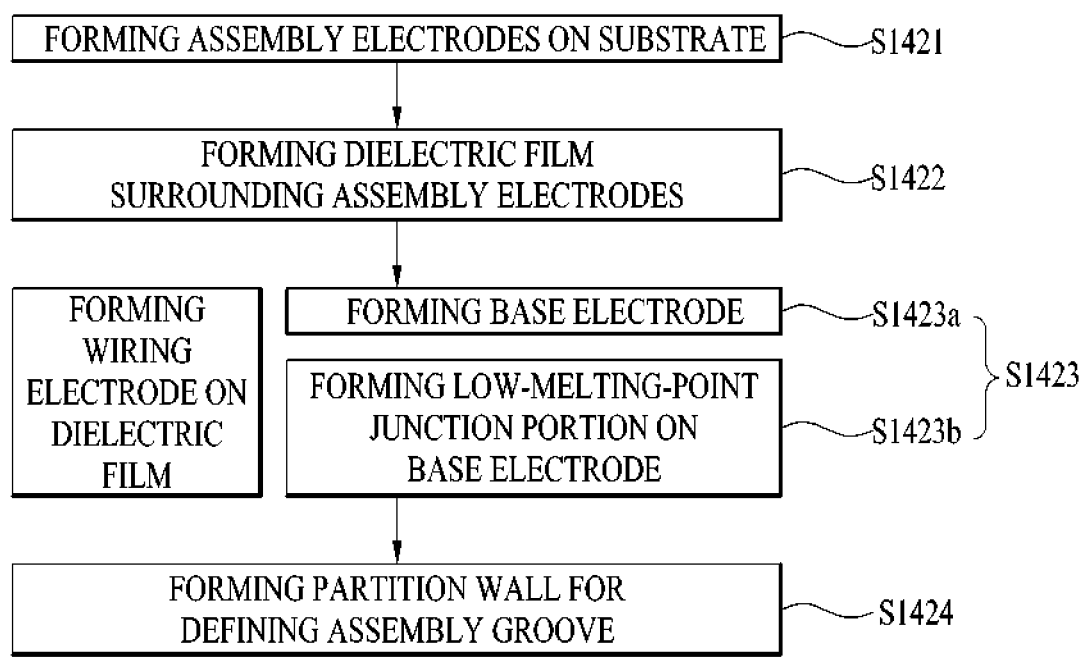
FIG. 20 is a flowchart illustrating a process of manufacturing an assembly substrate of the present disclosure.

FIG. 20 is a flowchart illustrating a process of manufacturing an assembly substrate of the present disclosure.

First, the assembly electrodes are formed on the substrate (S1421). The assembly electrodes may include a pair of assembly electrodes. The alternating voltage having a constant voltage difference is applied to each electrode in the future to generate the electric field.

Thereafter, the dielectric film surrounding the assembly electrodes is formed (S1422). The dielectric film serves to protect the assembly electrodes.

Thereafter, the wiring electrode is formed on the dielectric film (S1423). As described above, the wiring electrode of the present disclosure may be composed of the base electrode of a basic shape and the low-melting-point junction portion. Accordingly, the base electrode is formed on the dielectric film (S1423a), and the low-melting-point junction portion is formed on the base electrode (S1423b). In one example, the low-melting-point junction portion may be located inside the assembly groove to be defined in the future.

Finally, the partition wall is formed to define the assembly groove (S1424). A partial region of the partition wall may overlap the wiring electrode. For example, the partition wall may be formed on a region of the wiring electrode except for the base electrode and the low-melting-point junction portion located inside the assembly groove.

In view of the entire gist of the present specification, at a level that may be understood by those skilled in the art, deleting and changing some operations of the flowchart shown in FIG. 20 also fall within the scope of the present disclosure.

Figure 21:
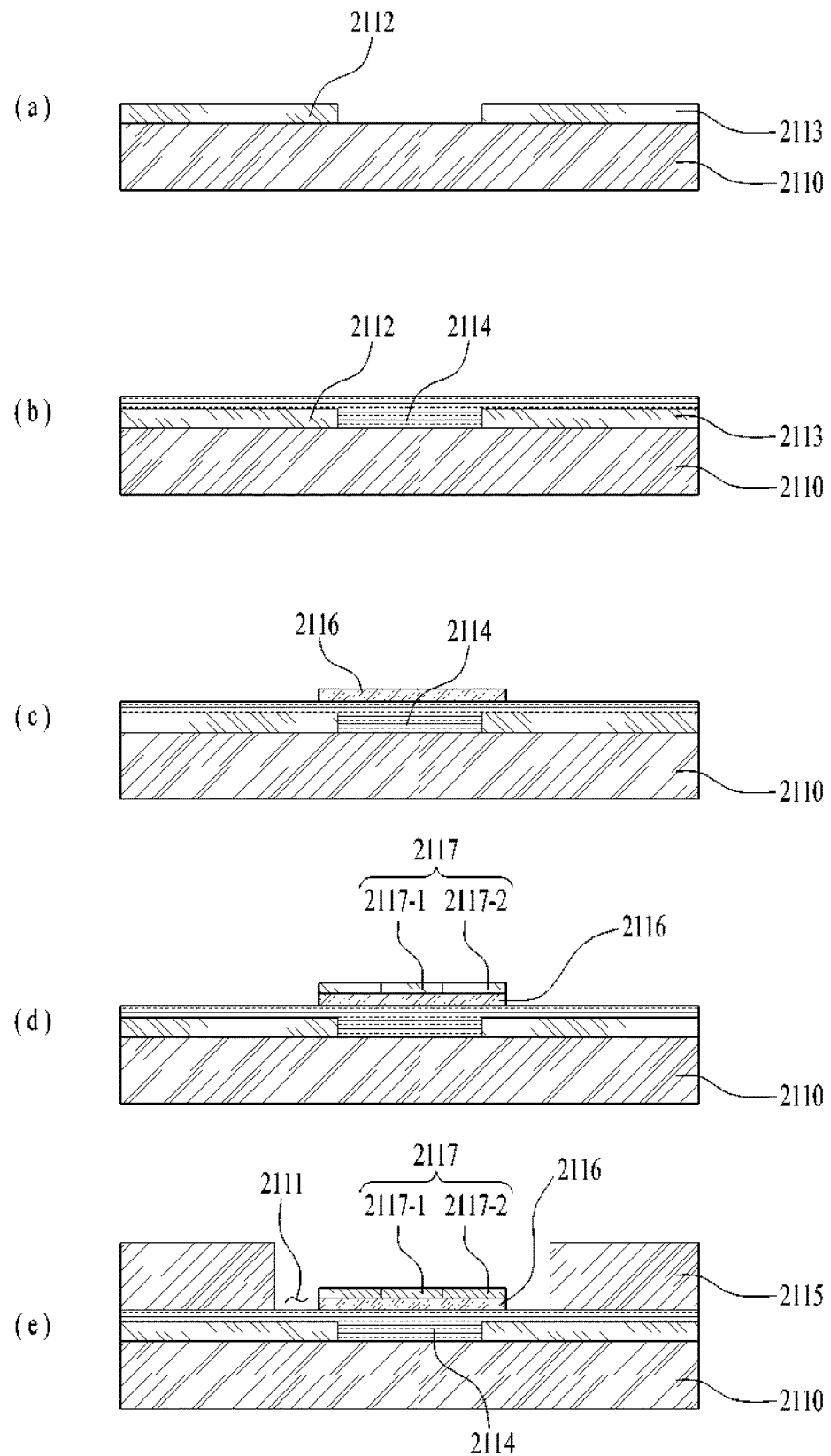
FIG. 21 illustrates cross-sectional views illustrating a manufacturing process according to a flowchart in FIG. 20.

FIG. 21 illustrates cross-sectional views illustrating a manufacturing process according to a flowchart in FIG. 20.

As shown in (a) of FIG. 21, a pair of assembly electrodes 2112 and 2113 are formed on a substrate 2110.

Thereafter, as shown in (b) of FIG. 21, a dielectric film 2114 is formed to surround the assembly electrodes 2112 and 2113. The dielectric film 2114 may be formed by spin coating, bar coating, chemical vapor deposition, or the like.

Thereafter, as shown in (c) of FIG. 21, a base electrode 2116 is formed on the dielectric film 2114. The base electrode 2116 may partially overlap with the assembly electrodes 2112 and 2113.

Thereafter, as shown in (d) of FIG. 21, a low-melting-point junction portion 2117 is formed on the base electrode 2116. The base electrode 2116 and the low-melting-point junction portion 2117 serve as the wiring electrode electrically connected to one surface of the semiconductor light emitting element. In addition, the low-melting-point junction portion may be positioned in a form in which a plurality of bars intersect. For example, although not clearly distinguished in the cross-sectional view of (d) of FIG. 21, the low-melting-point junction portion 2117 may be composed of a first bar 2117-1 directed in the first direction and a second bar 2117-2 directed in the second direction. In addition, a flow blocking angle may be formed at an intersection of the bars as described above.

Finally, as shown in (e) of FIG. 21, a partition wall 2115 defining an assembly groove 2111 in which the semiconductor light emitting element is assembled may be formed on the dielectric film 2114.

Figure 22:
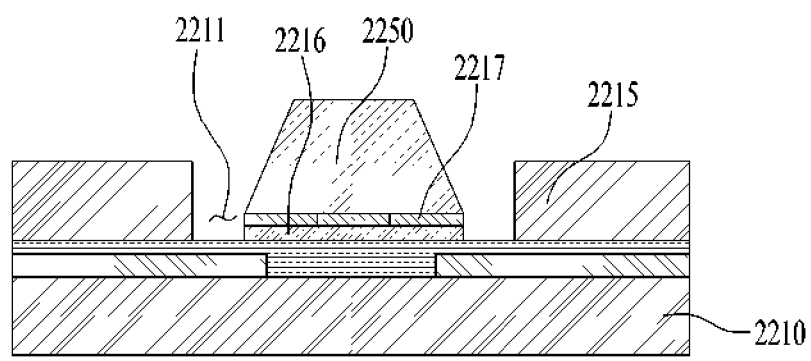
FIG. 22 illustrates views illustrating a process of performing a wiring process for electrically connecting a semiconductor light emitting element to an assembly substrate.
Figure 22:
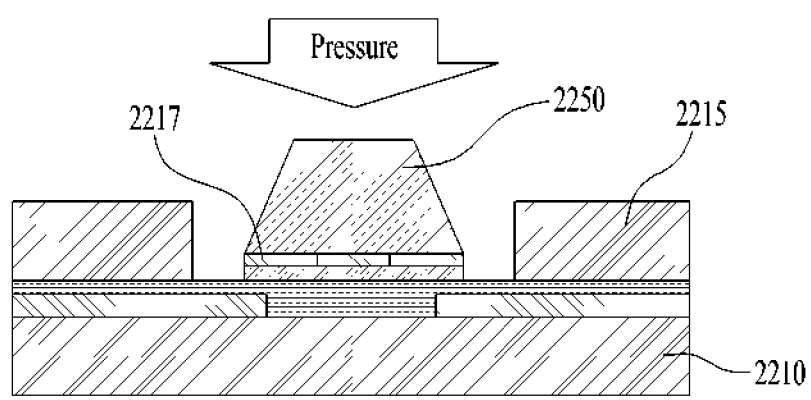

FIG. 22 illustrates views illustrating a process of performing a wiring process for electrically connecting a semiconductor light emitting element to an assembly substrate.

In FIG. 22, (a) illustrates a shape in which a semiconductor light emitting element 2250 is assembled into an assembly groove 2211 of an assembly substrate. In the assembly substrate, the assembly groove 2211 is defined by a partition wall 2215 formed on the substrate 2210, and a base electrode 2216 and a low-melting-point junction portion 2217 are located on a bottom surface of the assembly groove 2211. In addition, the semiconductor light emitting element 2250 is in contact with a top surface of the low-melting-point junction portion 2217.

In FIG. 22, (b) is a view illustrating a wiring process of the semiconductor light emitting element 2250 in (a) of FIG. 22. The semiconductor light emitting element 2250, which is the vertical type semiconductor light emitting element, may have the conductivity-type electrodes respectively positioned on both surfaces thereof. Through the wiring process, the conductivity-type electrode formed on one surface of the semiconductor light emitting element 2250 and the low-melting-point junction portion 2217 positioned on the substrate 2210 may be electrically connected to each other. The wiring process may include an operation of applying a pressure from above the semiconductor light emitting element 2250 and an operation of heating and melting the low-melting-point junction portion 2217.

As described above, the low-melting-point junction portion 2217 includes the metal layer with the low melting point, which is melted in the temperature range from about 100 degrees to 250 degrees. Thus, the wiring process may be performed in, for example, a chamber having a temperature of 200 degrees.

Figure 23:
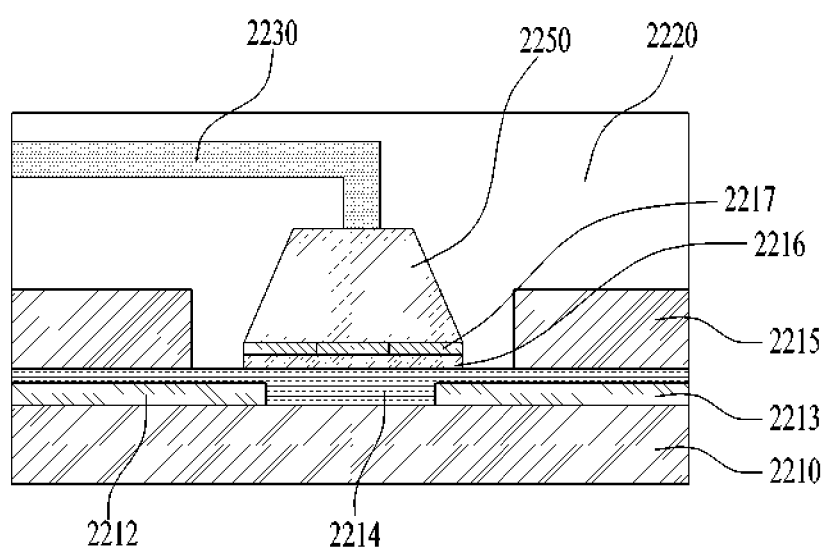
FIG. 23 is a cross-sectional view of a semiconductor light emitting element in FIG. 22 after performing an additional wiring process.

FIG. 23 is a cross-sectional view of a semiconductor light emitting element in FIG. 22 after performing an additional wiring process.

Specifically, in the case of the semiconductor light emitting element 2250 in FIG. 22, one surface of the element in contact with the low-melting-point junction portion 2217 is electrically connected. In one example, in the case in FIG. 23, an opposite surface of the semiconductor light emitting element 2250, which is not in contact with the low-melting-point junction portion 2217, is electrically connected to another wiring electrode 2230. To this end, an interlayer insulating film 2220 for covering a top of the semiconductor light emitting element 2250 assembled onto the assembly substrate may be formed. Thereafter, the wiring electrode 2230 electrically connected to the semiconductor light emitting element 2250 may be formed through an etching process and a deposition process. In the assembly substrate, assembling electrodes 2212 and 2213 for generating the electric field, a dielectric film 2214 for protecting the assembly electrodes 2212 and 2213, and the partition wall 2215 for defining the assembly groove is located on the substrate 2210. In addition, the base electrode 2216 and the low-melting-point junction portion 2217 are located inside the assembly groove.

The above description is merely illustrative of the technical idea of the present disclosure. Those of ordinary skill in the art to which the present disclosure pertains will be able to make various modifications and variations without departing from the essential characteristics of the present disclosure.

Therefore, embodiments disclosed in the present disclosure are not intended to limit the technical idea of the present disclosure, but to describe, and the scope of the technical idea of the present disclosure is not limited by such embodiments.

The scope of protection of the present disclosure should be interpreted by the claims below, and all technical ideas within the scope equivalent thereto should be construed as being included in the scope of the present disclosure.

The invention claimed is:

1. A display device comprising:
a substrate;
a pair of assembly electrodes positioned on the substrate;
a dielectric film positioned on the pair of assembly electrodes;
a wiring electrode including a base electrode and a low-melting-point junction portion positioned on the dielectric film;
a partition wall overlapping a partial region of the wiring electrode and positioned on the dielectric film, wherein the partition wall defines an assembly groove configured to receive a semiconductor light emitting element; and
the semiconductor light emitting element assembled into the assembly groove and electrically connected to the low-melting-point junction portion of the wiring electrode,
wherein the low-melting-point junction portion is positioned on the base electrode and is formed in a shape of a plurality of intersecting bars, and includes a first bar directed in a first direction and a second bar directed in a second direction intersecting the first direction,
wherein the first direction corresponds to a long axis direction of the base electrode of the wiring electrode, and
wherein a length of the first bar is greater than a diameter of the assembly groove.

2. The display device of claim 1, wherein the low-melting-point junction portion has a flow blocking angle for controlling a thermal flow amount of the low-melting-point junction portion.

3. The display device of claim 2, wherein the flow blocking angle is defined in an intersection region of the plurality of intersecting bars.

4. The display device of claim 3, wherein, when the low-melting-point junction portion is melted, a thermal flow amount of the intersection region having the flow blocking angle is smaller than a thermal flow amount of ends of the plurality of intersecting bars.

5. The display device of claim 4, wherein the semiconductor light emitting element overlaps the intersection region of the low-melting-point junction portion.

6. The display device of claim 3, wherein the flow blocking angle is equal to or smaller than 90 degrees.

7. The display device of claim 1, wherein the first bar and the second bar intersect each other at a center point of the assembly groove.

8. The display device of claim 7, wherein the first bar and the second bar intersect each other perpendicularly.

9. The display device of claim 1, wherein the first bar and the second bar are located in the assembly groove.

10. The display device of claim 1, wherein certain regions of opposite ends of the second bar overlap the pair of assembly electrodes, respectively.

11. The display device of claim 1, wherein a height of the partition wall is smaller than a height of the semiconductor light emitting element.

12. The display device of claim 1, wherein the low-melting-point junction portion includes a metal layer melted in a temperature range from 100 to 250 degrees Celsius.

13. A method for manufacturing a display device, the method comprising:
providing a semiconductor light emitting element;
preparing an assembly substrate including assembly electrodes and a wiring electrode formed thereon, and an assembly groove defined in the assembly substrate;
putting the semiconductor light emitting element into a chamber filled with a fluid and placing the assembly substrate on a surface of the chamber;
assembling the semiconductor light emitting element into the assembly groove of the assembly substrate using a magnetic field and an electric field; and
removing the assembly substrate from the chamber and electrically connecting the semiconductor light emitting element to the wiring electrode of the assembly substrate,
wherein the preparing of the assembly substrate includes forming the wiring electrode on a dielectric film, the wiring electrode including a base electrode and a low-melting-point junction portion on the base electrode.

14. The method of claim 13, wherein the preparing of the assembly substrate includes:
forming the assembly electrodes on a substrate;
forming the dielectric film surrounding the assembly electrodes; and
forming a partition wall positioned on the wiring electrode and defining the assembly groove in the assembly substrate.

15. The method of claim 14, wherein the low-melting-point junction portion includes, on the base electrode, a first bar formed in a long axis direction of the base electrode and a second bar intersecting the first bar.

16. The method of claim 15, wherein the first bar and the second bar are located inside the assembly groove.

17. The method of claim 14, wherein the electrically connecting of the semiconductor light emitting element to the wiring electrode includes:
applying a pressure from above the semiconductor light emitting element; and
heating and melting the low-melting-point junction portion.

* * * * *